US006697771B1

(12) United States Patent
Kondo et al.

(10) Patent No.: US 6,697,771 B1
(45) Date of Patent: Feb. 24, 2004

(54) SEMICONDUCTOR DEVICE MANUFACTURING SYSTEM AND THE METHOD THEREOF

(75) Inventors: Masaki Kondo, Kanagawa-ken (JP); Nobutoshi Aoki, Kanagawa-ken (JP)

(73) Assignee: Kabushiki Kaisha Toshiba, Kanagawa (JP)

( * ) Notice: Subject to any disclaimer, the term of this patent is extended or adjusted under 35 U.S.C. 154(b) by 771 days.

(21) Appl. No.: 09/605,136

(22) Filed: Jun. 27, 2000

(30) Foreign Application Priority Data

Jun. 30, 1999 (JP) .......................................... 11-186782
Jul. 27, 1999 (JP) .......................................... 11-212512

(51) Int. Cl.[7] ........................... G06F 17/10; G06F 17/50
(52) U.S. Cl. ............................... 703/2; 703/14; 700/29; 700/121
(58) Field of Search ............................... 703/2, 14, 22, 703/4, 12; 700/29, 30, 31, 121; 716/1, 2, 20; 382/145, 147; 257/48, 314, 565, 138; 375/500; 438/372

(56) References Cited

U.S. PATENT DOCUMENTS

| | | | | | |
|---|---|---|---|---|---|
| 5,751,023 | A | * | 5/1998 | Aono | 257/138 |
| 5,819,073 | A | * | 10/1998 | Nakamura | 375/500 |
| 6,154,718 | A | * | 11/2000 | Sakamoto | 703/12 |
| 6,304,834 | B1 | * | 10/2001 | Enda | 703/4 |
| 6,316,324 | B1 | * | 11/2001 | Honna et al. | 438/372 |
| 6,484,305 | B1 | * | 11/2002 | Syo | 716/20 |

OTHER PUBLICATIONS

Suetake et al., M. Precise Physical Modeling of the Reverse–Short–Channel Effect for Circuit Simulation, International Conference on Simulation of Semiconductor Processes and Devices, SISPAD '99, Sep. 1999, pp. 207–210.*

Matsuzawa et al., K. Simulation Analysis of Impurity Profile Extraction by SCM, Extended Abstracts of 1998 Sixth International Workshop on Computational Electronics, IWCE–6, Oct. 1998, pp. 267–269.*

Williams et al., R.A. ADAM: A Two Dimensional, Two--Carrier MOSFET Simulator Based on Generalized Stream Functions, IEEE Transactions on Computer–Aided Design, vol. 7, No. 2, Feb. 1988, pp. 243–250.*

D'Avanzo et al., D. Effects of the Diffused Impurity Profile on the DC Characteristics of VMOS and DMOS Devices, IEEE Journal of Solid–State Circuits, vol. SC–12, No. 4, Aug. 1977, pp. 356–362.*

Goodwin–Johansson et al., S.H. Two–Dimensional Impurity Profiling with Emission Computed Tomography Techniques, IEEE Transactions on Computer–Aided Design, vol. 8, No. 4, Apr. 1989, pp. 323–335.*

(List continued on next page.)

Primary Examiner—Russell Frejd
(74) Attorney, Agent, or Firm—Pillsbury Winthrop LLP

(57) ABSTRACT

The semiconductor device manufacturing system of the present invention comprises: insulating film determination unit for determining whether an insulating film is present on the substrate surface or not; in-insulating-film impurity concentration extraction unit for extracting the concentration of an impurity contained in the insulating film on the substrate surface; diffusion parameter determination unit for determining diffusion parameter values constituting the diffusion equation as a function of the concentration of the impurity contained in the insulating film; and in-substrate impurity profile extraction unit for extracting the impurity profile information in the substrate by solving the diffusion equation in which the diffusion parameter values are introduced.

28 Claims, 16 Drawing Sheets

OTHER PUBLICATIONS

Fair et al., R.B. Two–Dimensional Process Simulation Using Verified Phenomenological Models, IEEE Transactions on Computer–Aided Design, vol. 10, No. 5, May 1991, pp. 643–651.*

Balamurugan et al., G. New Analytic Models and Efficient Parameter Extraction for Computationally Efficient 1–D and 2–D Ion Implantation Modeling, Electron Devices Meetings, IEEE, IEDM '98 Technical Digest, Sep. 1998, pp. 517–520.*

Strojwas, A. CMU–CAM System, Proceedings of the $22^{nd}$ ACM/IEEE Conference on Design Automation, IEEE, Jun. 1985, Paper 21.2, pp. 319–325.*

Shin, Hyungsoon and Al F. Tasch, Jr.; "A New Approach to Verify and Derive a Transverse–Field–Dependent Mobility Model for Electrons in MOS Inversion Layers," IEEE Transactions on Electron Devices, vol. 36, No. 6, Jun. 1989, pp. 1117–1124.

* cited by examiner

FIG. 16A $\mu(E_y, C, N_{sub})$ $$= \mu\text{eff}\left(\frac{E_y + E_o}{2}\right) + \frac{N_{SUB} + C}{C} \cdot \frac{\alpha\,\mu\text{eff}}{\alpha E_y} \cdot \int_o^y \frac{C}{N_{SUB} + C}\,\alpha y$$

FIG. 16B $$\begin{cases} \mu_c = f_1(N_{SUB}) \cdot \left[\exp(f_2(N_{SUB}) \cdot C) - 1\right] \\ f_x = \dfrac{C_x}{N_{SUB}{}^{\alpha x}} \quad (X = 1, 2) \end{cases}$$

SEMICONDUCTOR DEVICE MANUFACTURING SYSTEM AND THE METHOD THEREOF

BACKGROUND OF THE INVENTION

1. Field of the Invention

The present invention relates to a semiconductor device manufacturing system and a semiconductor device manufacturing method in which impurity profile information in the substrate of a semiconductor device to be manufactured is extracted (process simulation) by solving a diffusion equation of an impurity in the substrate, the electric characteristics of a semiconductor device by using the mobility model of carriers are evaluated on the basis of an impurity profile in the semiconductor substrate and the information of an device structure (device simulation), the manufacturing conditions for a semiconductor device having desired electric characteristics are determined on the basis of the evaluation result, and a semiconductor device is manufactured on the basis of the determined manufacturing conditions and, more particularly, to a technique which exactly predicts the electric. characteristics of a semiconductor device to be manufactured and determines the manufacturing conditions for the semiconductor device at a high accuracy to improve the yield of the process for manufacturing semiconductor devices.

2. Description of the Related Art

In recent years, with rapid progress of micropatterning of semiconductor integrated circuits, micropatterning of a MOSFET (Metal-Oxide Silicon Field Effect Transistor) which is one of semiconductor devices constituting an integrated circuit is rapidly advanced. From these backgrounds, a reduction in thickness of a gate oxide film in the MOSFET is further advanced.

On the other hand, in a recent MOSFET, in order to suppress a short channel effect generated in a semiconductor substrate, a gate electrode in which an n-type impurity is implanted is used for an n-type MOSFET (to be referred as an n MOSFET hereinafter), and a gate electrode in which a p-type impurity is implanted is used for a p-type MOSFET (to be referred to as a pMOSFET hereinafter). In this manner, an electrode structure in which the gate electrodes of the nMOSFET and the pMOSFET are set to the n-type and the p-type, respectively is called a dual gate electrode. In general, when a semiconductor device having a dual gate electrode is to be manufactured, first an impurity implanting process for forming a source-drain region is performed to a gate electrode region. Thereafter, an annealing process is performed to a semiconductor substrate such that activation of an impurity in the source-drain region and diffusion of an impurity to the entire gate electrode region are performed.

However, in the method for manufacturing a semiconductor device, when a reduction in thickness of the gate oxide film is advanced, the impurity implanted in the gate electrode passes through the gate oxide film to reach the semiconductor substrate, and a problem that device characteristics such as a threshold voltage of the semiconductor device considerably change is occurred.

For this reason, recently, in order to suppress an impurity from a gate oxide film into a semiconductor substrate and to prevent degradation of device characteristics, nitrogen is added into the gate oxide film, and the process for suppressing diffusion of the impurity in the gate oxide film into the semiconductor substrate. As methods for adding nitrogen into the gate oxide film, up to now, a method which forms an oxide film which does not contain nitrogen on the semiconductor substrate in advance, performs annealing in an atmosphere of a gas such as NO, $N_2O$, or $NH_3$, and introduces nitrogen into the gate oxide film, a method which nitrides and oxidizes a semiconductor substrate by using an $NO_2$ gas or a gas mixture of $N_2O$ and $O_2$, and the like are known.

However, a phenomenon that diffusion of an impurity in a gate oxide film is suppressed by introducing nitrogen into the gate oxide film has been apparent. However, up to now, any knowledge related a hidden mechanism in the nitride-oxide film forming process or the influence on a semiconductor substrate such as how to change an impurity profile state in a semiconductor substrate such as a source-drain region by the nitride-oxide film forming process, an influence on diffusion of an impurity in a semiconductor substrate by the thermal step to be performed later cannot be obtained.

For this reason, at present, it is very difficult to efficiently perform the nitride-oxide film forming process, and the yield of the steps in manufacturing a semiconductor device including the nitride-oxide film forming process is considerably small.

In order to solve these problems, evaluation of the nitride-oxide film forming step using a process/device simulation technique for predicting the electric characteristics of a semiconductor device by solving a physical equation is performed. However, as described above, at present, any knowledge related to the mechanism of nitride-oxide film formation or the influence thereof is not obtained. For this reason, the accuracy of the evaluation is very poor at present.

On the other hand, in a device simulation technique, as a model (e.g., see literature "S. A. Mujtaba and R. W. Dutton, "Semi-Empirical Local NMOS Mobility Model for 2-D Device Simulation Incorporating Screened minority Impurity Scattering", in Proc. NUPAD, pp. 3–6, 1994.") for calculating a component obtained by ionized impurity scattering of local mobility of carriers in a MOS inversion layer, a functional model in which a component obtained by ionized impurity scattering of local mobility of carriers is in proportion to the αth power of a local carrier density and is in inverse proportion to the βth power of an impurity concentration is used. This model has a problem that experimental value of an impurity concentration in a wide area cannot be reproduced by one parameter set. More specifically, FIG. 1 is a graph showing a device simulation of a universal curve using the Mujtaba model and an experimental result. In FIG. 1, when the impurity concentration is about the 16th power to 17th power, the experimental result is almost equal to the simulation result. However, when the impurity concentration is the 18th power, the simulation result does not reproduce the experimental result at all. In this case, the condition in which the impurity concentration is the 18th power is generally seen in a micro-semiconductor device of a quarter submicron generation.

As described above, in a semiconductor device manufacturing system and a semiconductor device manufacturing method using a conventional process/device simulation technique, it is difficult to exactly predict the electric characteristics of a semiconductor device and to determine manufacturing conditions for the semiconductor device. For this reason, the yield of a process for manufacturing semiconductor devices, especially, the yield of a process for manufacturing semiconductor devices including a nitride-oxide film forming process cannot be easily increased at present.

SUMMARY OF THE INVENTION

The present invention has been made in consideration of the above circumstances, and has as its object to provide a semiconductor device manufacturing system which increases the yield of a process for manufacturing semiconductor device.

The present invention has been made in consideration of the above circumstances, and has as its another object to provide a semiconductor device manufacturing method which increases the yield of a process for manufacturing semiconductor devices.

The semiconductor device manufacturing system of the present invention comprises: insulating film determination unit for determining whether an insulating film is present on the substrate surface or not; in-insulating-film impurity concentration extraction unit for extracting the concentration of an impurity contained in the insulating film on the substrate surface; diffusion parameter determination unit for determining diffusion parameter values constituting the diffusion equation as a function of the concentration of the impurity contained in the insulating film; and in-substrate impurity profile extraction unit for extracting the impurity profile information in the substrate by solving the diffusion equation in which the diffusion parameter values are introduced.

Also, the semiconductor device manufacturing method of the present invention comprises the steps of: determining whether an insulating film is present on the substrate surface or not; extracting the concentration of an impurity contained in the insulating film on the substrate surface; determining diffusion parameter values constituting the diffusion equation as a function of the concentration of the impurity contained in the insulating film; and extracting the impurity profile information in the substrate by solving the diffusion equation in which the diffusion parameter values are introduced.

In the semiconductor device manufacturing system of the present invention, the model for calculating the component obtained by the ionized impurity scattering of the local mobility of carriers represents the relationship between the component obtained by the ionized impurity scattering of the local mobility of carriers, a local carrier concentration, and a local impurity concentration, and is a function type model expressing the relationship that a component obtained by ionized impurity scattering of an effective mobility of carriers is in proportion to an exponent of an average carrier concentration and is in inverse proportion to an exponent of an average impurity concentration.

Also, in the semiconductor device manufacturing method of the present invention, the model for calculating the component obtained by the ionized impurity scattering of the local mobility of carriers represents the relationship between the component obtained by the ionized impurity scattering of the local mobility of carriers, a local carrier concentration, and a local impurity concentration, and is a function type model expressing the relationship that a component obtained by ionized impurity scattering of an effective mobility of carriers is in proportion to an exponent of an average carrier concentration and is in inverse proportion to an exponent of an average impurity concentration.

BRIEF DESCRIPTION OF DRAWINGS

FIGS. 16A and 16B show equations of components obtained by ionized impurity scattering of a local mobility of carriers according to the embodiment of the present invention.

DETAILED DESCRIPTION OF THE PREFERRED EMBODIMENTS

A semiconductor device manufacturing system according to an embodiment of the present invention will be described below.

Semiconductor Device Manufacturing System

First, the configuration of a semiconductor device manufacturing system according to an embodiment of the present invention will be described.

Figure 10:
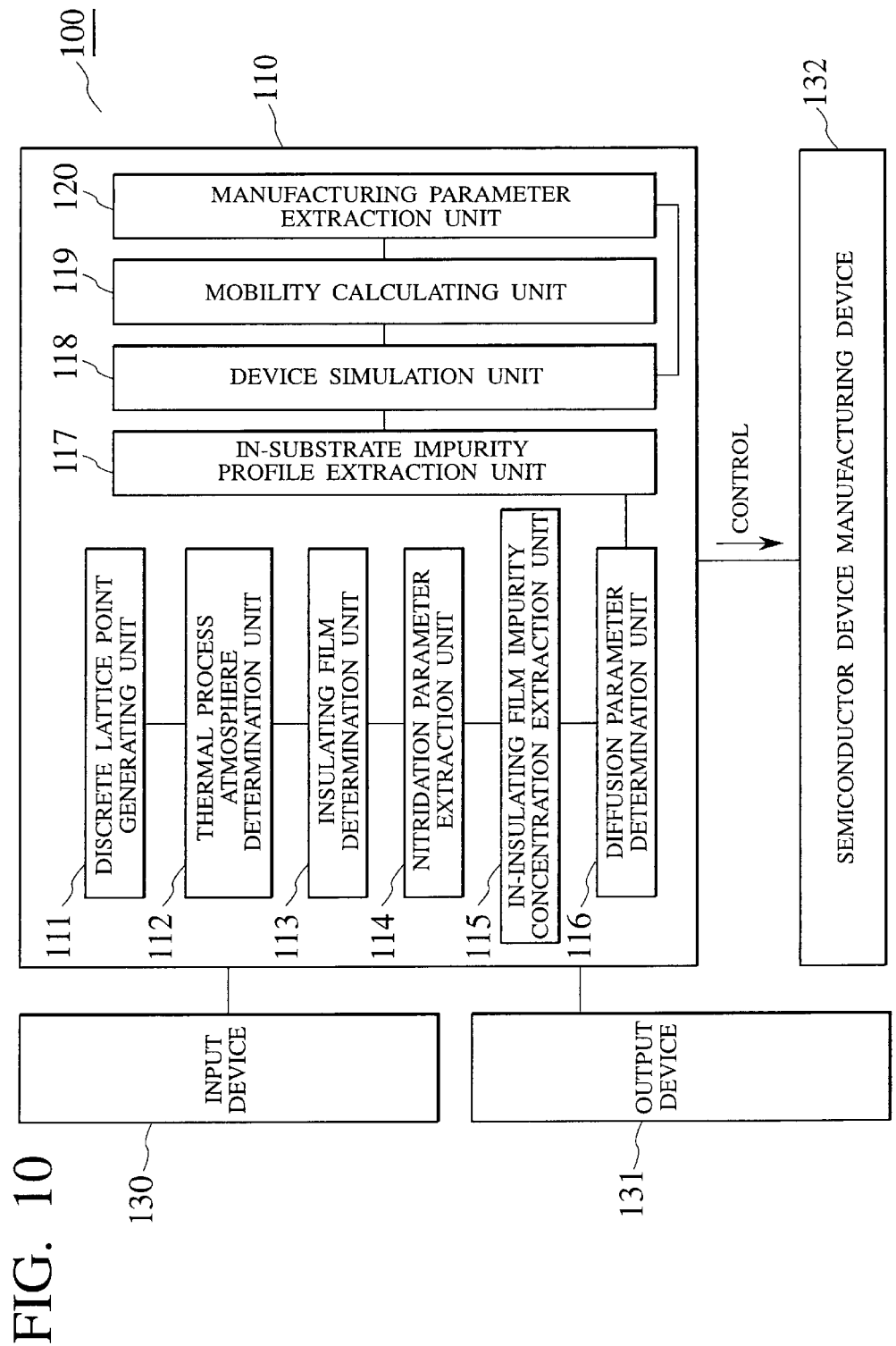
FIG. 10 is a block diagram showing the configuration of a semiconductor device manufacturing system according to an embodiment of the present invention.

The semiconductor device manufacturing system according to the embodiment of the present invention, as shown in FIG. 10, is constituted by a manufacturing process control device (process/device simulation device) 110 which evaluates an impurity profile in a semiconductor substrate, evaluates the electric characteristics of a semiconductor device by using a mobility model of carriers on the basis of the impurity profile in the semiconductor substrate and the information of an device structure, and extracts semiconductor device manufacturing conditions for obtaining desired element characteristics on the basis of the evaluation results, a semiconductor device manufacturing device 132 which manufactures a semiconductor device on the basis of the semiconductor device manufacturing conditions extracted from the manufacturing process control device 110, an input device 130 for inputting input information and various parameters related to the manufacturing process control device 110, and an output device 131 for outputting various output data such as manufacturing conditions and a warning display.

The manufacturing process control device 110 comprises a discrete lattice point generation unit 111 for generating discrete lattice points for a process simulation in a semiconductor device structure for evaluating an impurity profile, a thermal process atmosphere determination unit 112 for determining an atmosphere in the thermal step performed to a semiconductor substrate, an insulating film determination unit 113 for determining whether an insulation film is present on the semiconductor substrate surface, a nitridation parameter extraction unit 114 for extracting various parameters related to the nitridation process, an in-insulating-film impurity concentration extraction unit 115 for extracting an impurity concentration in an insulating film, a diffusion parameter determination unit 116 for determining various parameters related to the thermal diffusion process, an in-substrate impurity profile extraction unit 117 for extracting an impurity profile in the semiconductor substrate on the basis of the set parameter values, an device simulation unit 118 for analyzing device characteristics on the basis of the impurity profile in the semiconductor substrate, a mobility calculating unit 119 for calculating a local electric field, a local carrier concentration, and the value of a local mobility as a function of an impurity concentration, and a manufacturing parameter extraction unit 120 for extracting manufacturing conditions for the semiconductor device on the basis of an output from the device simulation unit 118.

Here, an input device such as a keyboard or a mouse is preferably used as the input device 130, and a display device such as a display or a printing device such as a printer is preferably used as the output device 131. As the device simulation unit 118, a typical device simulation technique may be used. As the semiconductor device manufacturing device 132, for example an impurity implantation device.

Figure 11:
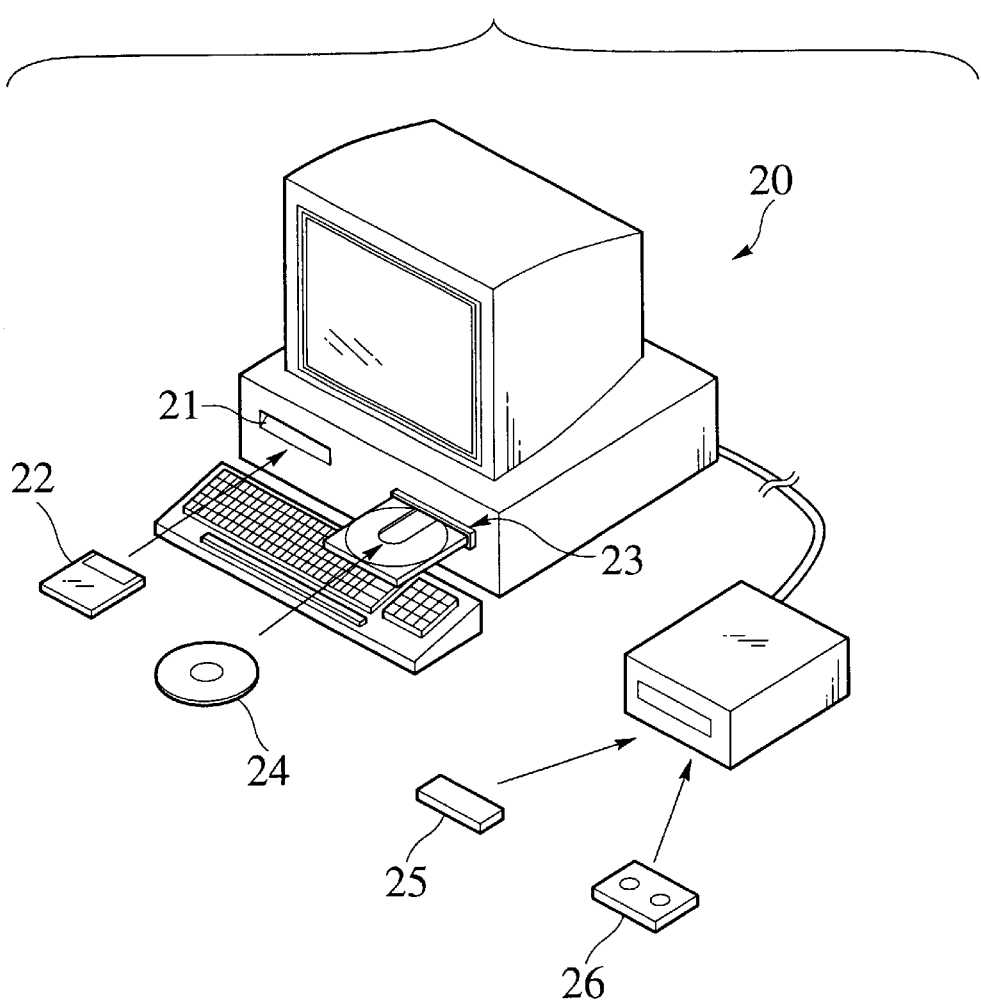
FIG. 11 is an illustration showing the outline of a manufacturing process control device according to the embodiment of the present invention.
Figure 12:
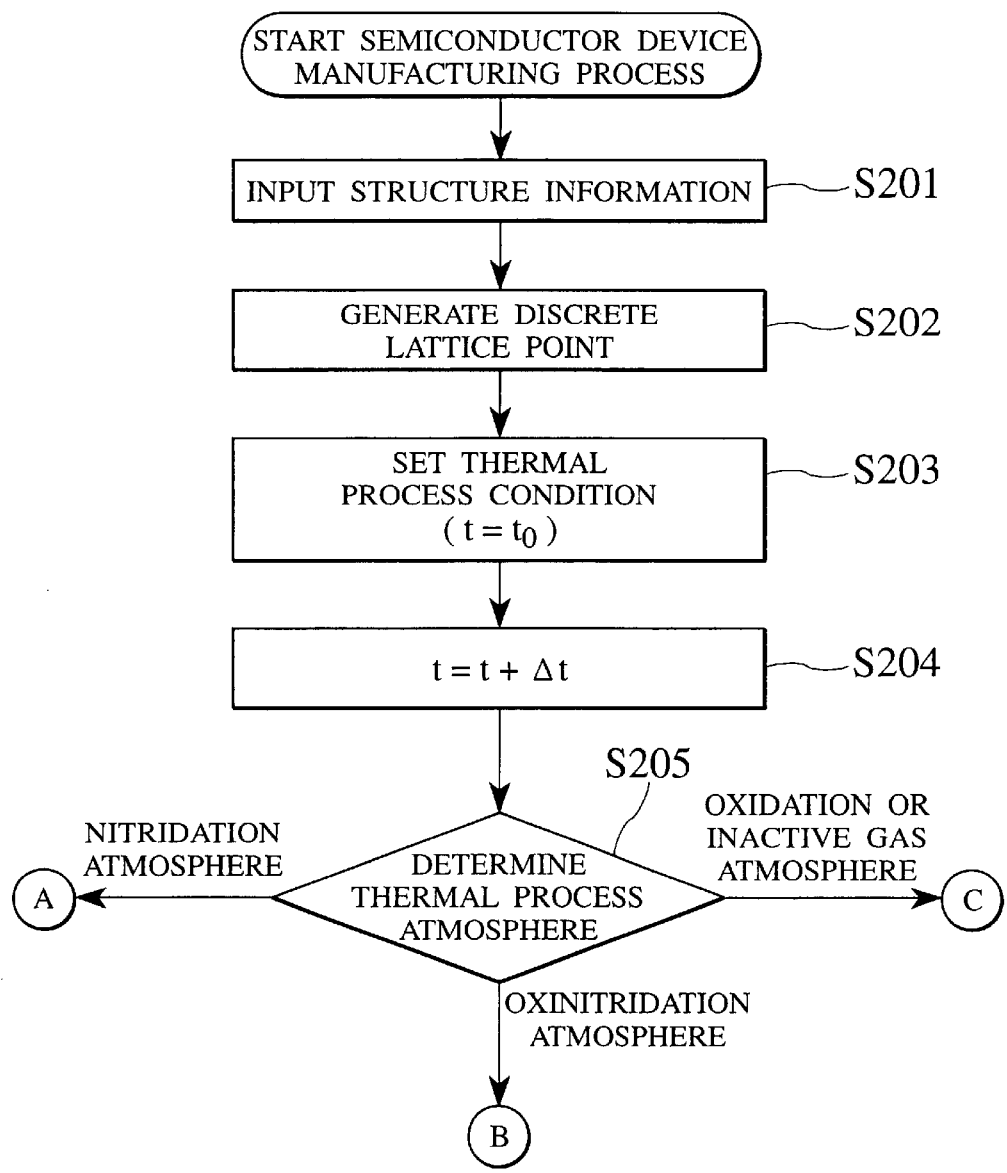
FIG. 12 is a flow chart showing a semiconductor device manufacturing method according to the embodiment of the present invention.
Figure 13:
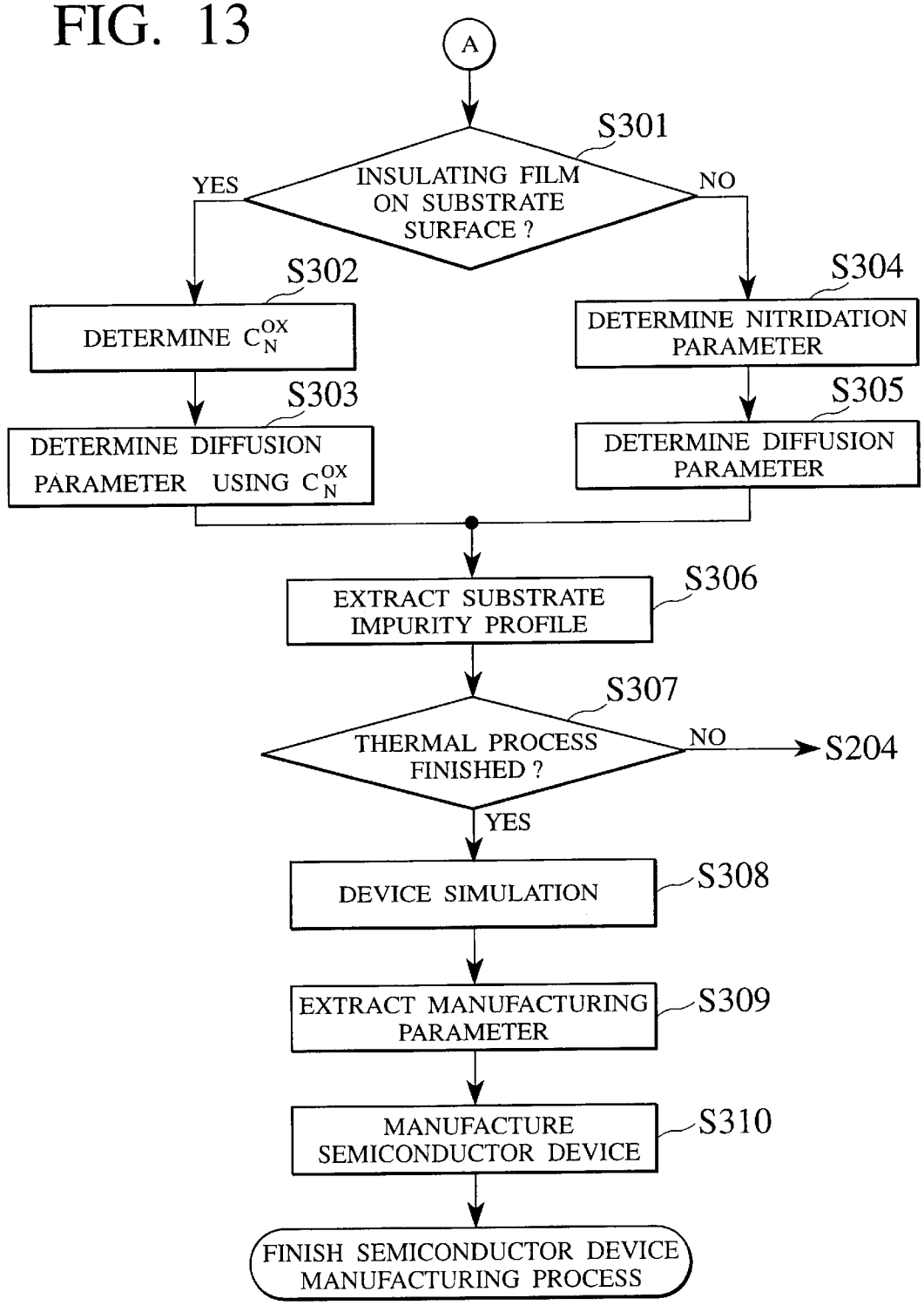
FIG. 13 is a flow chart showing a semiconductor device manufacturing method according to the embodiment of the present invention.
Figure 14:
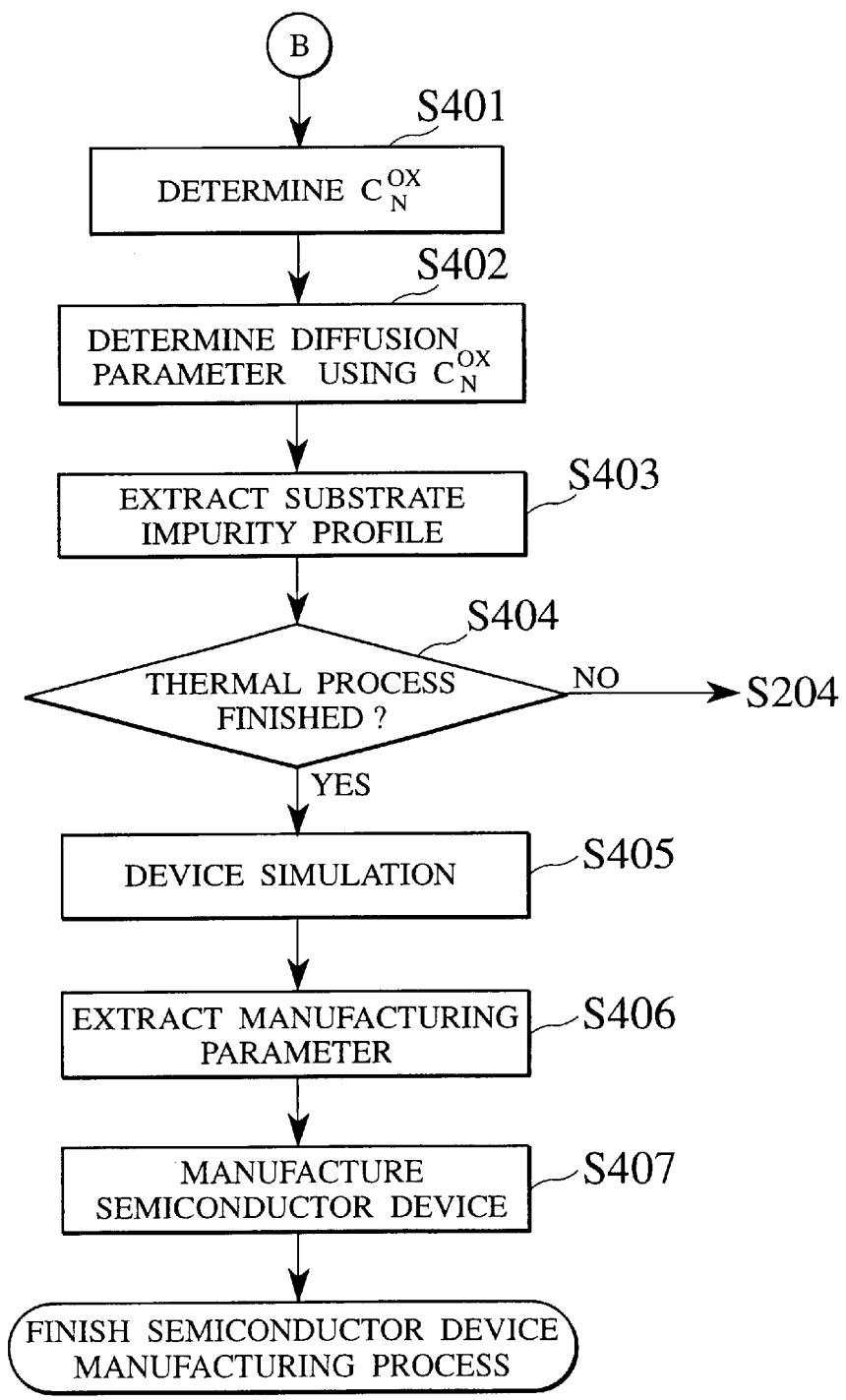
FIG. 14 is a flow chart showing a semiconductor device manufacturing method according to the embodiment of the present invention.
Figure 15:
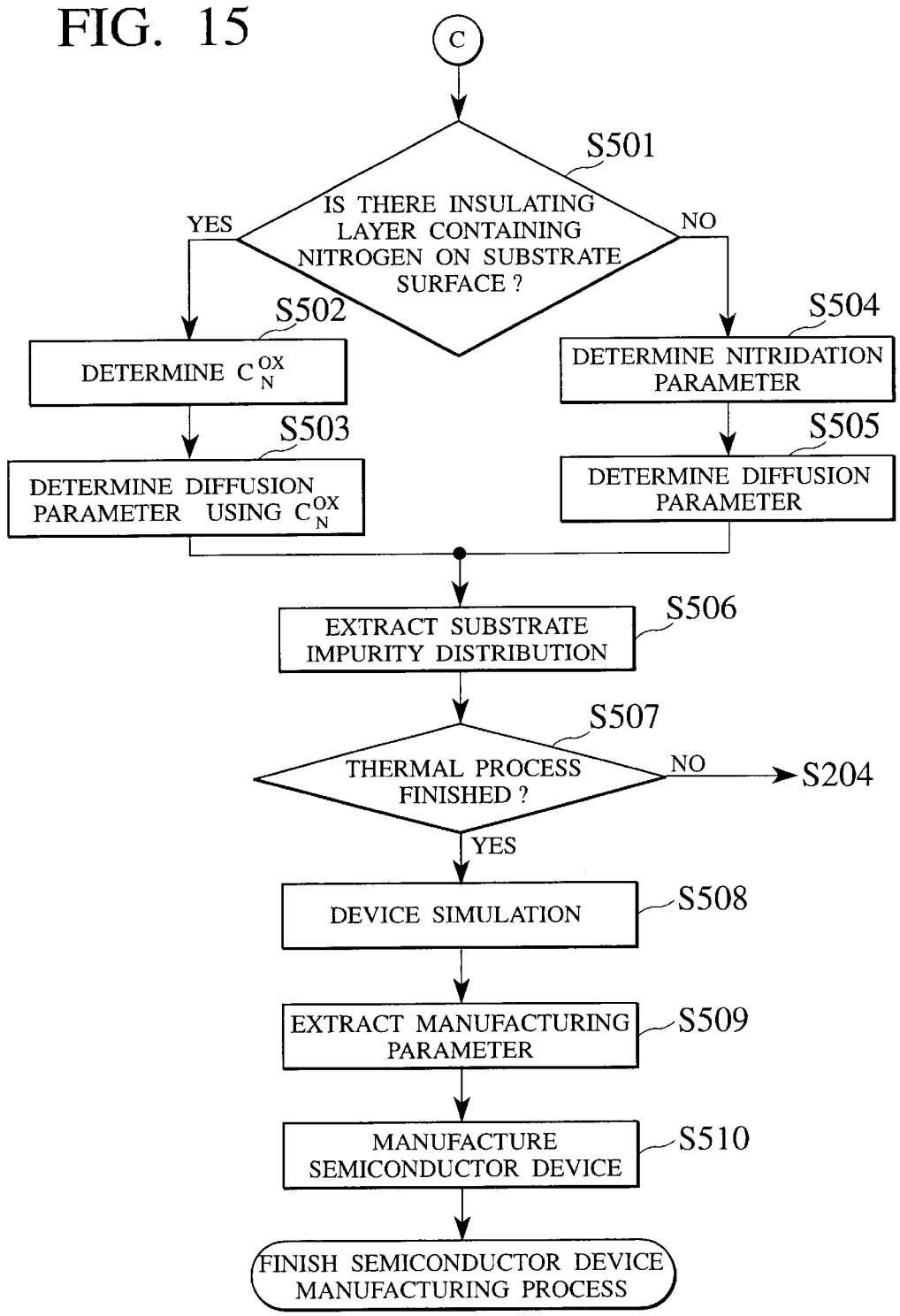
FIG. 15 is a flow chart showing a semiconductor device manufacturing method according to the embodiment of the present invention.

The manufacturing process control device according to the embodiment of the present invention has an outline like the configuration shown in FIG. 11, for example. More specifically, the manufacturing process control device according to the embodiment of the present invention is constituted such that the respective elements of the manufacturing process control device are incorporated in a computer system. The computer system comprises a floppy disk drive 21 and an optical disk drive 23. A floppy disk 22 is inserted into the floppy disk drive 21, and an optical disk 24 is inserted into the optical disk drive 23. When predetermined reading operations are performed, semiconductor device manufacturing programs stored in these recording media can be installed in the computer system. When a predetermined drive device is connected to the computer system, for example, by using a ROM 25 serving as a memory device or a cartridge 26 serving as a magnetic tape device, installation or data reading/writing can also be executed.

Semiconductor Device Manufacturing Method

A semiconductor device manufacturing method according to the embodiment of the present invention using the semiconductor device manufacturing system will be described below.

The semiconductor device manufacturing method according to the embodiment is roughly divided into three steps, i.e., the process simulation step for extracting impurity profile information in the substrate of a semiconductor device to be manufactured by solving a diffusion equation of an impurity in the substrate, the device simulation step for evaluating the electric characteristics of a semiconductor by using a mobility model of carriers and determining manufacturing conditions for a semiconductor device having desired electric characteristics on the basis of the evaluation result, and the semiconductor device manufacturing step for manufacturing a semiconductor device on the basis of the determined manufacturing conditions, and the process and device simulations are devised to increase the yield of the manufacturing process.

Therefore, first, the characteristics of process and device simulation methods according to the embodiment of the present invention will be described.

Process Simulation

Figure 2:
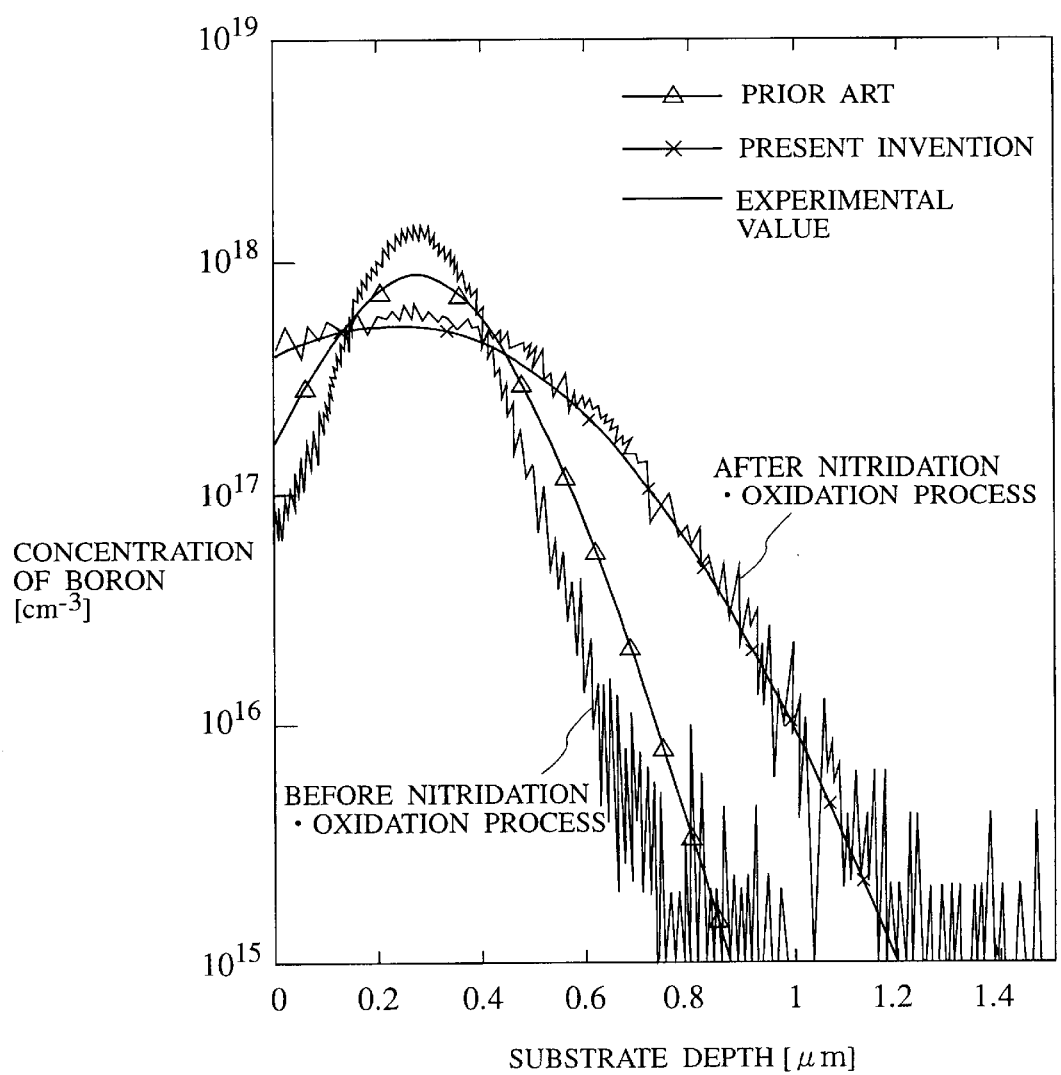
FIG. 2 is a graph showing an impurity profile in a semiconductor substrate obtained from an experiment, a conventional impurity profile extraction means, and an impurity profile extraction means.
Figure 3:
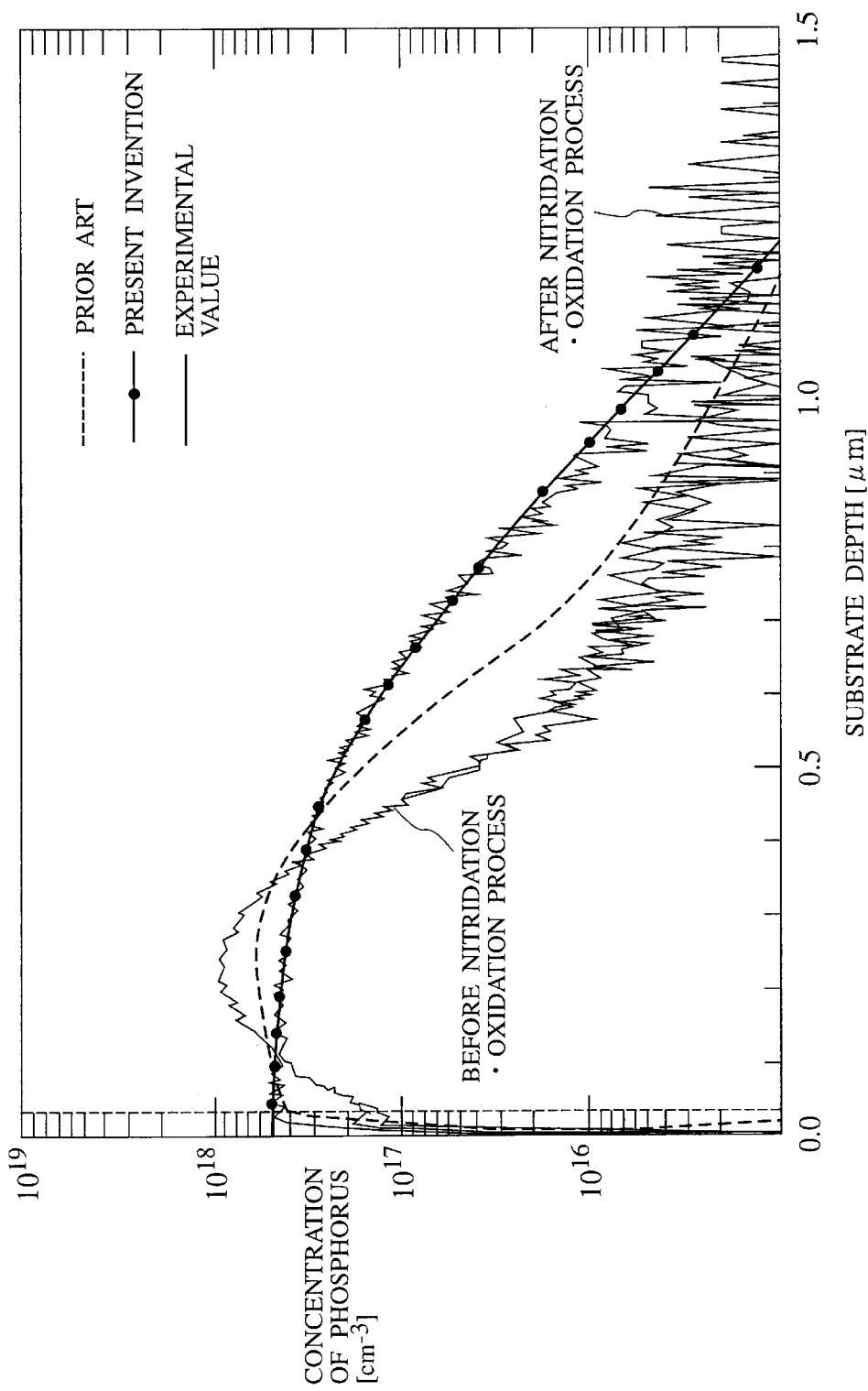
FIG. 3 is a graph showing an impurity profile in a semiconductor substrate obtained from an experiment, a conventional impurity profile extraction means, and an impurity profile extraction means.

FIGS. 2 and 3 are graphs showing impurity profiles of boron and phosphorus, which are obtained by an experiment, a conventional process simulation method, and a process simulation method according to the present invention, in a silicon substrate before and after a nitride-oxide film forming process. As is apparent from the drawings, with the nitride-oxide film forming process, the impurity profile in the silicon substrate largely changes, the impurity profile obtained from the experiment after the nitride-oxide film is formed differs greatly from the result extracted from the conventional process simulation method. The experimental values are collected in the steps: (1) implanting boron or phosphorus into the silicon substrate as an impurity, performing an annealing process to recover the damage of the silicon substrate by impurity implantation, forming an oxide film on a silicon substrate surface, and performing impurity profile measurement before the nitride-oxide film is formed; (2) measure an impurity profile before the nitride-oxide film is formed, performing an annealing process in an ammonium atmosphere and a thermal step process in a dry oxygen atmosphere, and performing impurity profile measurement after a nitride-oxide film is formed.

In this manner, the reason why the experimental values are largely different from the values obtained by the conventional process simulation method with respect to the impurity profile after a nitride-oxide film is formed is as follows. The conventional simulation method has no physical model for evaluating the nitridation process in an ammonium atmosphere and the subsequent oxidation step, and a physical model obtained by simply extending a conventional known physical model is used when the semiconductor device manufacturing process is evaluated as in this experiment. More specifically, conventionally, since an oxidation enhancement diffusion phenomenon in which the diffusion rate of an impurity such as boron or phosphor in a silicon substrate increases during the oxidation step is recognized, an impurity profile in the silicon substrate is evaluated by simply using a simple oxidation enhancement diffusion model without considering the influence an impurity introduced into the oxide film at all. In the oxidation enhancement diffusion model mentioned here, diffusion coefficients are defined by the following equations on the assumption that a diffusion coefficient D0 at which enhancement by oxidation cannot be seen becomes DOED by oxidation enhancement diffusion. A diffusion equation is solved by using the diffusion coefficients determined by the following equations.

$$DOED = (1 + fOED) \times D0 \tag{1-1}$$

$$fOED = fi \times (Vox)\alpha \tag{1-2}$$

(Vox: oxidation rate, fi: physical quantity which is not dependent on the oxidation rate Vox and which is determined by the type of an impurity, a temperature, and an oxidation atmosphere, α: appropriate parameter value).

Therefore, in the process simulation method according to the embodiment of the present invention, in order to improve the accuracy of evaluation for an impurity profile in a semiconductor substrate, the diffusion model expressed by the above equation is not simply used without any change to evaluate a semiconductor device manufacturing process, fOED in Equation (1-2) is used as a function of an impurity contained in an insulating film on a semiconductor substrate surface, especially, an oxygen concentration, and the influence of the impurity introduced into the oxide film is considered.

More specifically, in this experiment, the concentration of nitrogen contained in a gate oxide film serving as the insulating film on the semiconductor substrate surface is about $1.5 \times 10^{15}$ [cm$^{-2}$], and the thickness of the gate oxide film is about 5 [nm]. For this reason, an average nitrogen concentration (CNav) in the gate oxide film is estimated as about $3 \times 10^{21}$ [cm$^{-3}$]. Although the atomic concentration (Cox) of the gate oxide film slightly changes depending on manufacturing conditions, the atomic concentration is approximately calculated by Cox=$2.3 \times 10^{23}$ [cm$^{-3}$]. Therefore, the content (rN) of nitrogen atoms in the gate oxide film is about 0.013. It is determined that a quantity of nitrogen which is enough to influence the element characteristics exists, and it is appropriate to roughly describe fOED in Equation (1-2) as a function of the nitrogen concentration. As one means for modeling the influence on the impurity diffusion of nitrogen, which is contained in the gate oxide film, in the silicon substrate, it is proposed that rN dependence is given to fOED of Equation (1-2).

Here, an example of fOED which is experimentally calculated is as follows:

$$fOED = fN(rN) \times (VoX)\alpha \tag{1-3}$$

$$fN(rN) = fi \times min\{fmax, 1 + 70 \times rN\} \tag{1-4}$$

where min{a, b} is a function where a small one of a and b is set, and fmax=20 is satisfied.

Results obtained by actually evaluating an impurity profile in a semiconductor substrate by the above procedure are also shown in FIGS. 2 and 3. As is apparent from the drawings, it is understood that an impurity profile extracted from the manufacturing process control method according to the embodiment of the present invention accurately reproduces an impurity profile after a nitride film is formed. For this reason, it can be said that the following idea inherent in the present invention is appropriate. That is, when diffusion parameters of a diffusion model used when an impurity profile in a semiconductor substrate is evaluated is set as a function of the concentration of an impurity contained in the gate oxide film on the semiconductor substrate surface, the evaluation accuracy of a process simulation for a semiconductor device manufacturing process is considerably improved.

In the embodiment of the numerical expressions, the diffusion parameters in the standard diffusion model as expressed in the numerical expressions are determined as functions of the nitrogen concentration in the gate oxide film. However, the forms of the functions can be arbitrarily set.

In the embodiment of the numerical expressions, the diffusion parameters are described as functions which are independent of the manufacturing process conditions such as an impurity and the atmosphere and the temperature of the thermal step. However, functions subordinate to the process conditions may be used as needed.

In addition, the diffusion model does not consider interlattice silicon or point defects such as holes. However, when a diffusion model which considers interaction between point defects and an impurity is used, for example, point defects are considered by determining generation/annihilation rate parameters of point defects on a silicon substrate surface as functions of a nitrogen concentration in an oxide film on a substrate surface or determining segregation parameters on an oxide film/silicon substrate interface of point defects as functions of the nitrogen concentration.

Furthermore, since the experiment described above is performed when the thickness of the oxide film is relatively small, e.g., 5 nm, the average nitrogen concentration in the oxide film is set to be a nitrogen concentration used when diffusion parameters in a semiconductor substrate. When the oxide film is thick or when nitrogen is localized near the oxide film/semiconductor substrate interface, as a nitrogen concentration used when the diffusion parameters in the substrate are stored, a nitrogen concentration on the interface may be used, or an average nitrogen concentration having an arbitrary range near the interface may be used.

In the experiment described above, impurity diffusion in the silicon substrate in the oxidation step when an oxide film containing nitrogen is described. When an oxide film is formed on a silicon substrate surface, and nitrogen is introduced into the oxide film by performing a thermal process in an ammonium atmosphere or the like, it is known that impurity diffusion of boron or the like is accelerated in the silicon substrate (reference: S. Mizuo, T. Kusaka, A. Shintani, M. Nanba, and H. Higuchi; J. Appl. Phys. Vol. 54 No. 7 pp. 3860–3866, 1983). In such a case, for example, by a method of increasing a diffusion coefficient depending on the nitrogen concentration in the oxide film, by a method of determining a quantity of generation of point defects on the oxide film/silicon substrate interface in a model which handles a reaction diffusion equation between point defects and an impurity, the impurity diffusion in the silicon substrate can be evaluated at a high accuracy.

Figure 4:
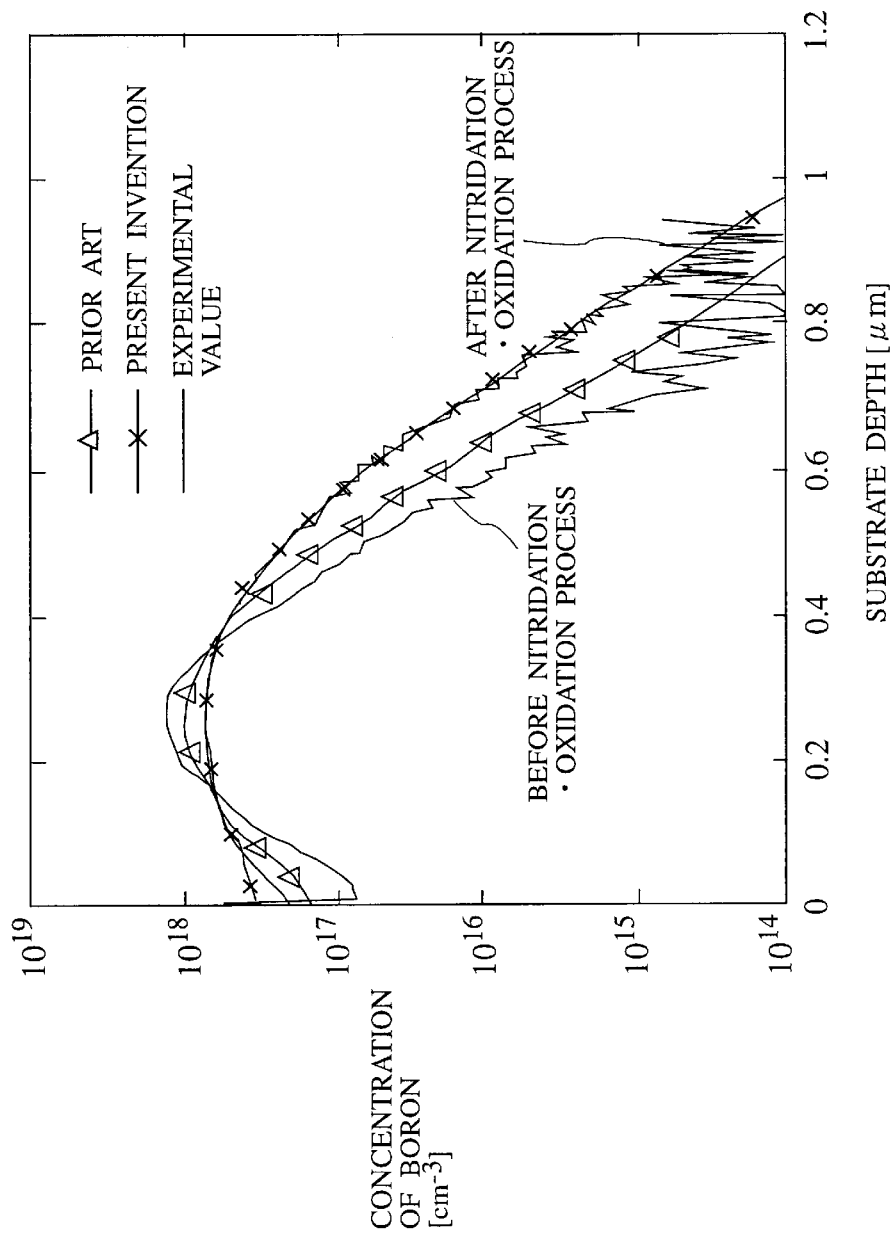
FIG. 4 is a graph showing an impurity profile in a semiconductor substrate obtained from an experiment, a conventional impurity profile extraction means, and an impurity profile extraction means.

According to the present invention, an impurity profile in a silicon substrate after the nitriding-oxidation step by using a nitrogen monoxide (NO) and the subsequent thermal step are executed can be evaluated at a high accuracy. More specifically, FIG. 4 is a graph showing boron profiles, which are obtained by an experiment, a conventional process simulation technique, and the present invention, in a silicon substrate before and after a nitridation-oxidation step using an NO gas and a thermal step. Here, in the experiment, after a thermal oxide film (10 nm) is formed on a silicon substrate surface, boron is ion-implanted, and an annealing process for recovering damage caused by the ion implantation is performed. In addition, a surface oxide film is removed, and a nitride-oxide film having a thickness of 2.5 nm is formed on the silicon substrate surface by a thermal step (950° C., 30 minutes). The conventional process simulation result is extracted by considering an oxidation enhanced diffusion (OED) effect obtained by forming the nitride-oxide film having a thickness of 2.5 nm on the silicon substrate surface, and the result of the present invention is extracted by using an OED effect which is four times the conventional OED effect. As is apparent from the drawing, according to the present invention, the impurity profile in the silicon substrate after the nitridation-oxidation step using an NO gas and the subsequent thermal step are executed can also be reproduced at a high accuracy.

Figure 5:
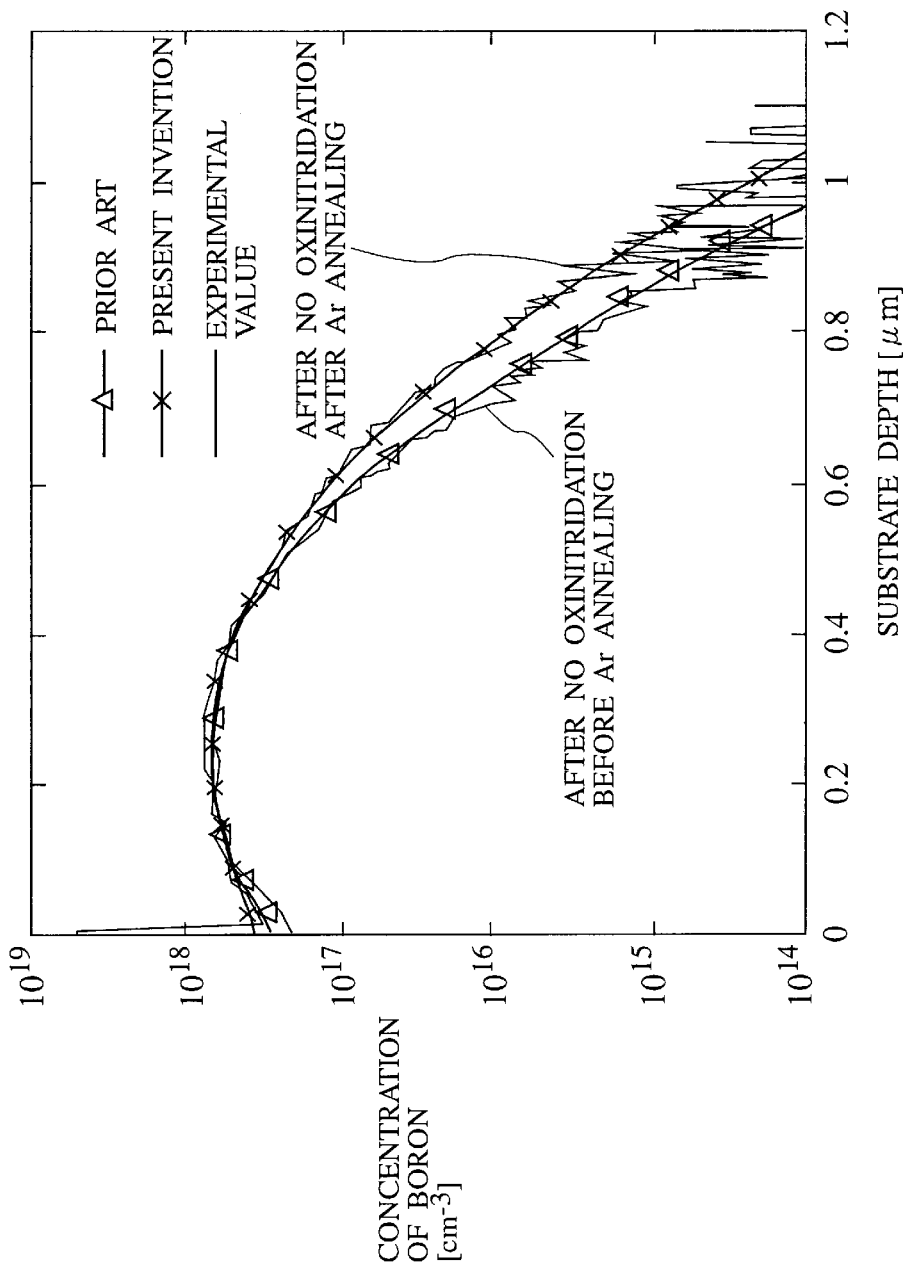
FIG. 5 is a graph showing an impurity profile in a semiconductor substrate obtained from an experiment, a conventional impurity profile extraction means, and an impurity profile extraction means.

In addition, according to the present invention, an impurity profile in a silicon substrate after the process for performing Ar annealing at 950° C. for 30 minutes after a nitridation-oxidation process is performed is performed in an NO atmosphere can be evaluated at a high accuracy. More specifically, FIG. 5 is a graph showing boron profiles, which are obtained by an experiment, the conventional process simulation technique, and the present invention, in a silicon substrate before and after the process for executing Ar annealing at 950° C. for 30 minutes after a nitridation-oxidation process is performed in an NO atmosphere. As is apparent from the experiment, impurity profile in the silicon substrate is enhanced by the Ar annealing process after the nitridation-oxidation step in the NO atmosphere is performed. In the present invention, a diffusion coefficient (DB) of boron in the silicon substrate is determined as a function of the nitrogen concentration in the nitride-oxide film. For example, the diffusion coefficient of boron in the silicon substrate will be described below:

$$DB=DB0\ (1+10rN) \tag{1-5}$$

where $DB0$ is an ordinary diffusion coefficient of boron in the silicon substrate. As a result, as is apparent from FIG. 5, according to the present invention using the equation described above, it was proved that an impurity profile, which was obtained after the step of executing Ar annealing at 950° C. for 30 minutes after a nitridation-oxidation process was performed in an NO atmosphere could be analyzed at a high accuracy. In this experiment, the diffusion coefficient of boron in the silicon substrate is extracted by the numerical expression (1-5). However, even though the expression is a complex expression having a form which includes variables such as the generation conditions of a nitride-oxide film and the subsequent annealing conditions, the expression is transformed into an expression having the form of a function of the impurity concentration in the nitride-oxide film, the concept of the present invention can be introduced. In addition, in the experiment, the diffusion coefficient of the impurity is determined as the function of the nitrogen concentration in attention to the diffusion of the impurity. However, for example, when impurity profile is evaluated on the basis of the reaction diffusion equation between point defects and the impurity, a physical equation related to generation of point defects on a silicon surface may be a function of the nitrogen concentration.

Figure 6:
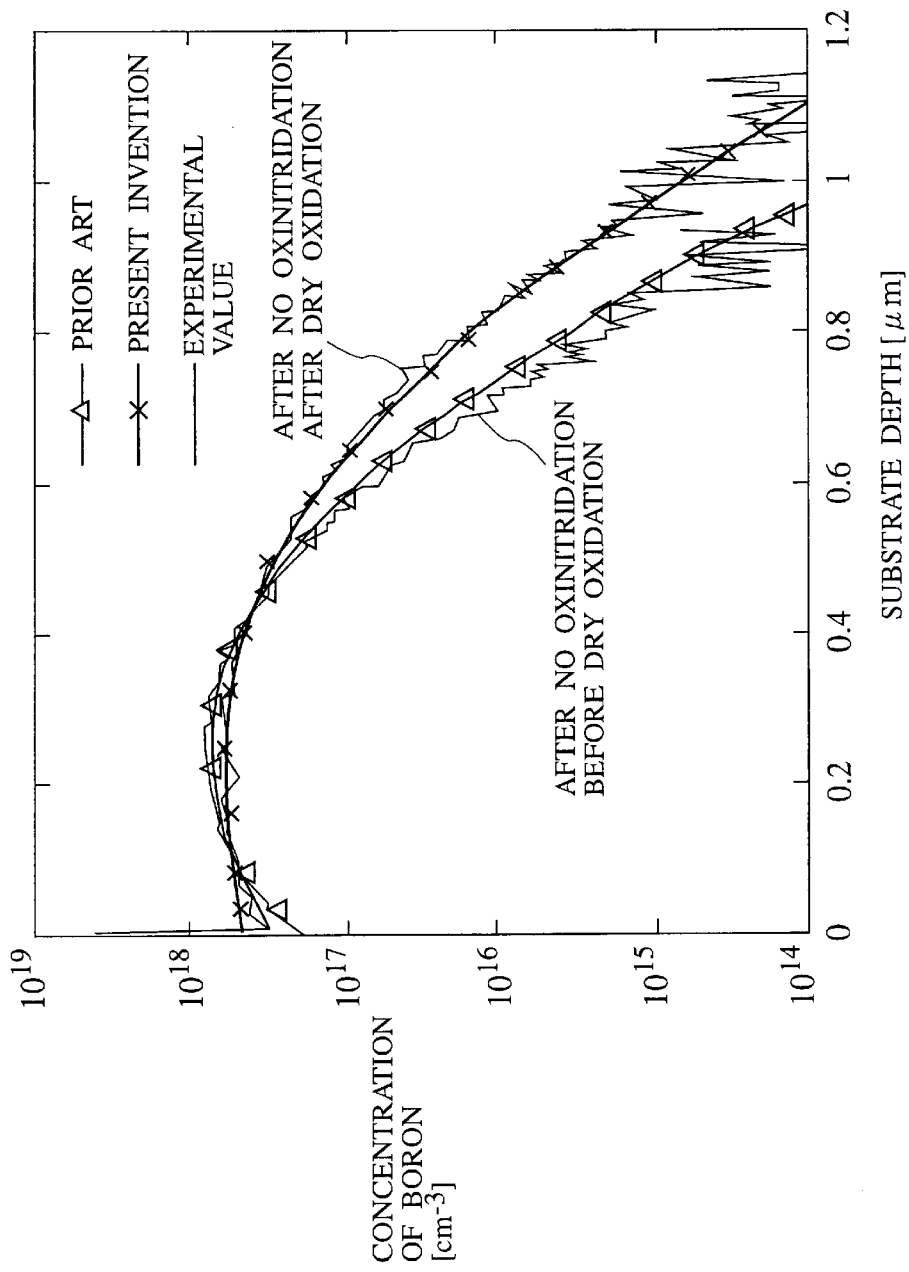
FIG. 6 is a graph showing an impurity profile in a semiconductor substrate obtained from an experiment, a conventional impurity profile extraction means, and an impurity profile extraction means.

Furthermore, according to the present invention, an impurity profile in a silicon substrate obtained after a dry oxidation step (950° C., 30 minutes) is performed after the nitride-oxide film is formed in the NO atmosphere can be evaluated at a high accuracy. More specifically, FIG. 6 is a graph showing boron impurity profiles which are obtained by an experiment, a conventional process simulation method, and the present invention, in a silicon substrate before and after the dry oxidation step is executed after a nitride-oxide film is formed in an NO atmosphere. As is apparent from the experiment, as in the oxidation step after the nitridation step performed by the $NH_3$, the impurity diffusion in the silicon substrate is enhanced. Therefore, according to the present invention, the thickness of the nitride-oxide film after the oxidation step is about 2.8 nm. For this reason, the impurity profile in the silicon substrate was evaluated on the assumption that the OED effect obtained by oxidation the substrate by only 3 nm in the oxidation step was considered and that the OED effect was ten times the OED effect obtained by a standard oxidation step. As a result, as is apparent from the drawing, according to the present invention, it was proved that the impurity profile in the silicon substrate after the dry oxidation step is executed after the nitride-oxide film is formed in the NO atmosphere could also be analyzed at a high accuracy.

In the experiment, the diffusion phenomenon of an impurity in a semiconductor substrate has been described such that a silicon substrate is used as the semiconductor substrate and such that boron or phosphorous is used as the impurity atom. Diffusion for an arbitrary impurity such as dopant such as indium (In) or antimony (Sb), an IV-group atom such as carbon (C) or germanium (Ge), other metals, or a halogen atom and point defects such as inter-lattice silicon or holes can be evaluated at a high accuracy by the same procedure as described above.

Device Simulation

In the device simulation method according to the present invention, when an analysis of device characteristics is performed (execution of a device simulation), a function type model derived on the basis of experiment facts related to a component obtained by ionized impurity scattering of an effective mobility is used to calculate a component obtained by ionized impurity scattering of a local mobility of carriers. In this manner, an effective mobility in an impurity concentration in a wide area is correctly reproduced by only one parameter set. A method of calculating the local mobility of carriers will be described below.

The characteristic feature of a mobility model of carriers used in an device characteristic analysis (device simulation) process in the device simulation method according to the embodiment of the present invention is that, as a model which expresses the characteristics of dependence on a component obtained by ionized impurity scattering of a local mobility and a local impurity concentration, a function type having the following natures is used.

(1) An experiment fact that component obtained by ionized impurity scattering of an effective mobility of carriers is in proportion to an exponent of an average carrier concentration and is in inverse proportion to an exponent of an average impurity concentration.

(2) An equation which is derived on the basis of the experiment fact in the item (1) and which is constituted by an equation appropriate to the physical relationship between the component obtained by ionized impurity scattering of a local mobility, a local carrier concentration, and an impurity concentration and parameters.

(3) The function type is appropriate to high-speed calculation.

Figure 7:
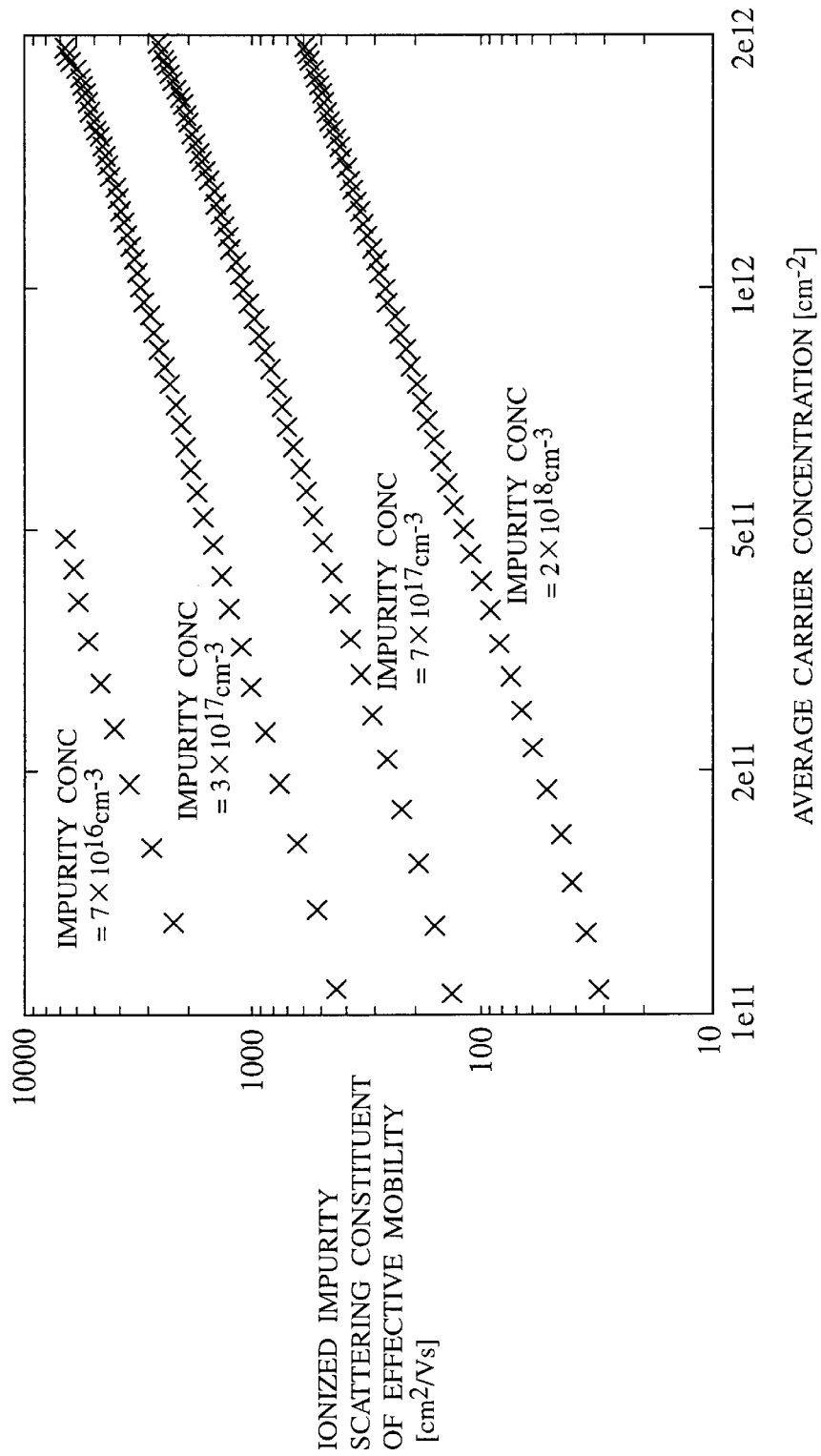
FIG. 7 is a graph showing the relationship between a component obtained by ionized impurity scattering of an experimental effective mobility, an average carrier concentration, and an impurity concentration.

FIG. 7 is a graph showing the relationship between a component (ordinate) obtained by ionized impurity scattering of an effective mobility of carriers, an average carrier concentration (abscissa), and an average impurity concentration which are based on the experiment. From the drawing, an experiment fact that the component obtained by ionized impurity scattering of the effective mobility of carriers is in proportion to an exponent of the average carrier concentration, and is in inverse proportion to an exponent of the average impurity concentration can be obtained. A model expressing the component obtained by ionized impurity scattering of a local mobility of carriers must have a function for reproducing at least the experiment fact.

From the experiment fact related to the effective mobility of carriers, the physical relationship between the component obtained by the ionized impurity scattering of the local mobility of carriers, the local carrier concentration, and the impurity concentration can be derived. The deriving procedure and execution thereof will be described below.

The effective mobility of carriers is defined by a value obtained such that a value obtained by integrating the product of the local carrier concentration and the local mobility of carriers from the semiconductor surface in the direction of depth is divided by the average carrier concentration. The definition equation and Poisson's equation in the semiconductor substrate calculated such that carrier concentration and the impurity concentration are considered at once are simultaneously and analytically solved. In this manner, by using a model equation of an effective mobility of carriers which is a function of an average electric field, an average carrier concentration, and an average impurity concentration, an equation for calculating the value of the local mobility serving as a function of a local carrier concentration, a local carrier concentration, and an impurity concentration is derived. The equation shown in FIG. 16A is an equation, derived as described above, for calculating the local mobility of carriers, and is an integrodifferential equation derived by Poisson's equation in the semiconductor substrate and the relational expression between the effective mobility of carriers and the local mobility of carriers. In this equation, $\mu$ denotes a local mobility; Ey denotes a local electric field; c denotes a local carrier concentration; NSUB denotes an impurity concentration; peff denotes an effective mobility; E0 denotes an electric field at the bottom of an inversion layer (zero in bulk); and y denotes a depth from the substrate surface.

Figure 8:
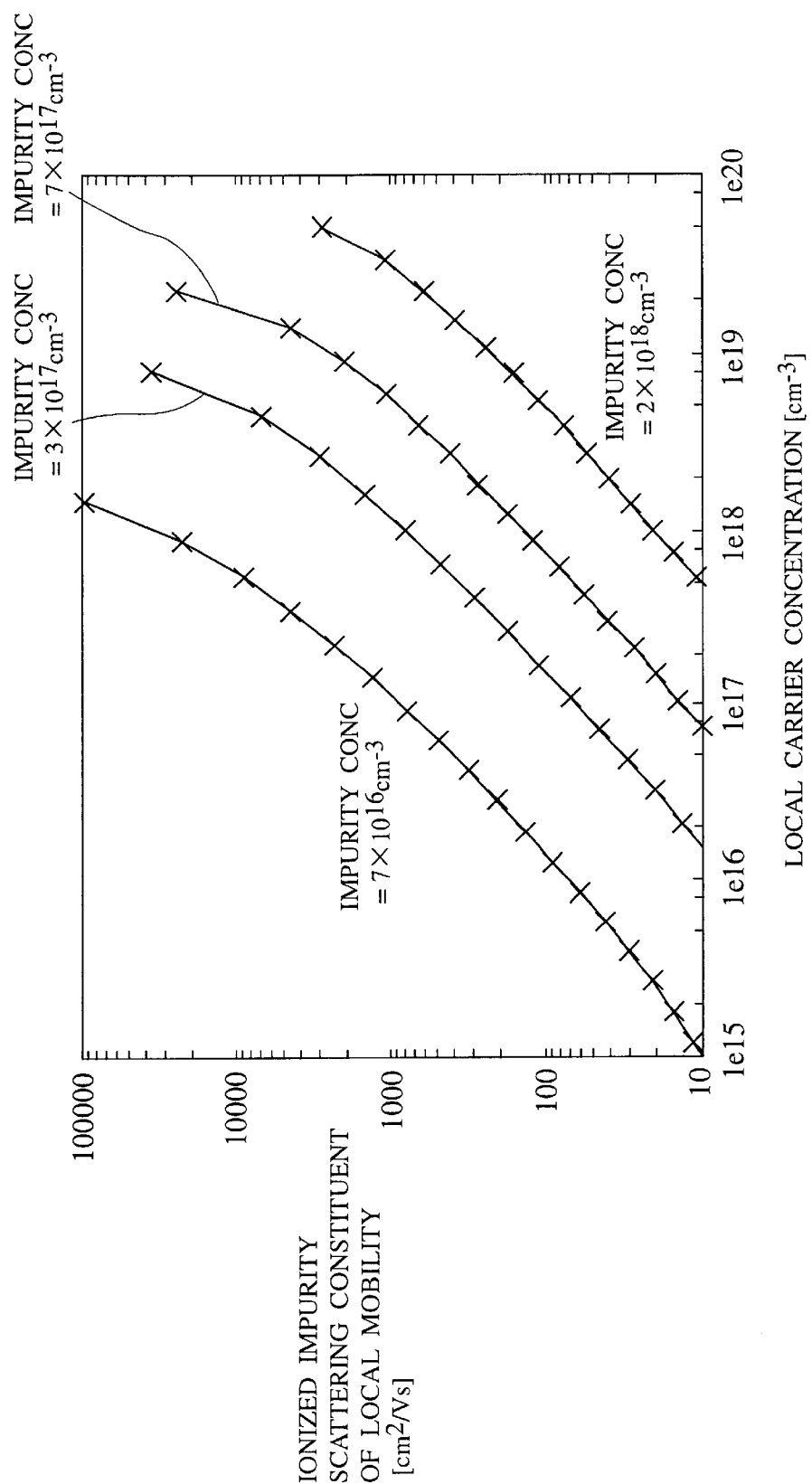
FIG. 8 is a graph showing the relationship between a component obtained by ionized impurity scattering of a local mobility, a local carrier concentration, and an impurity concentration.

FIG. 8 is a graph showing the relationship between a component (ordinate) obtained by ionized impurity scattering of a local mobility of carriers, a local carrier concentration (abscissa), and an impurity concentration which are calculated on the basis of the first equation and the experiment fact that a component obtained by ionized impurity scattering of an effective mobility is in proportion to an exponent of an average carrier concentration and is in inverse proportion to an exponent of an exponent of an average impurity concentration. In FIG. 8, qualitatively, the following relationship is found. That is, in a weak inversion state having a low local carrier concentration, the component obtained by ionized impurity scattering of the local mobility of carriers is in proportion to the local carrier concentration, and, in a strong inversion state having a high local carrier concentration, the component obtained by ionized impurity scattering of the local mobility of carriers is exponential-functionally dependent on the local carrier concentration. When the model comprises an equation and parameters which are appropriate to the characteristics of the component obtained by ionized impurity scattering of the local mobility of carriers, the reproductivity of the experiment fact related to the component obtained by the ionized impurity scattering of the effective mobility of carriers is assured.

Figure 1:
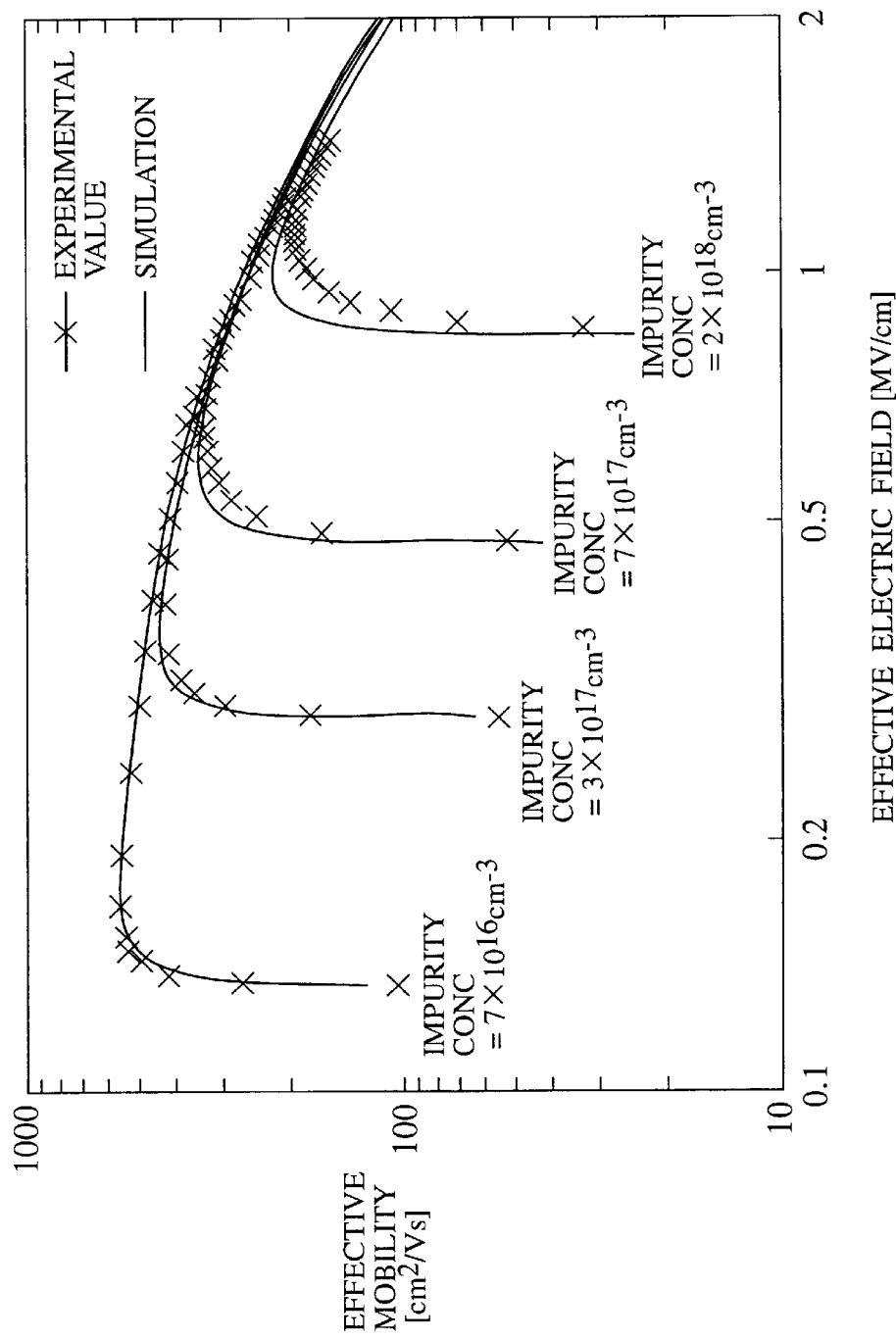
FIG. 1 is a graph showing a calculation result of a universal curve using a conventional mobility model and an experimental result.
Figure 9:
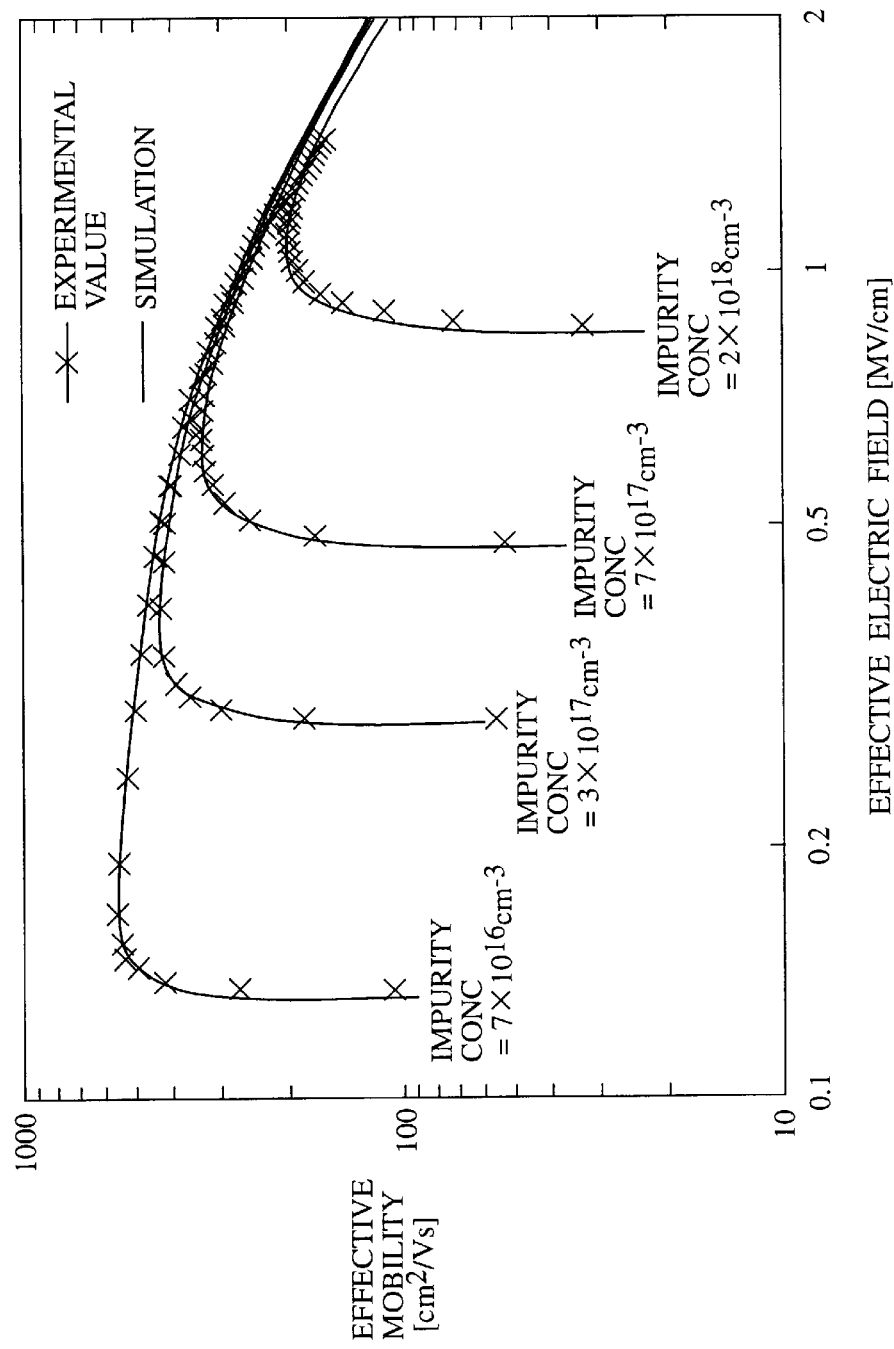
FIG. 9 is a graph showing a calculation result of a universal curve using a mobility model of the present invention and an experimental value.

In the function type model shown in FIG. 16A, at least one of a term depending on the local carrier concentration of the component obtained by the ionized impurity scattering of the local mobility of carriers and a term depending on the local impurity concentration is simplified by an elementary function, so that the characteristics of the integrodifferential equation can be approximately expressed. Therefore, as an analytic function type which can give an approximate solution which can calculate a mobility at a high speed to the relationship between the component obtained by the ionized impurity scattering of the local mobility shown in FIG. 8, the local carrier concentration, and the impurity concentration, the equation shown in FIG. 16B and obtained by simplifying both the dependent terms by the elementary function is cited. In this equation, $\mu c$ denotes a component obtained by ionized impurity scattering of a local mobility; c denotes a local mobility; NSUB denotes an impurity concentration; and Cx and $\alpha x$ (x=1, 2) denote parameters. A universal curve in a MOS inversion layer calculated by using the second equation is shown in FIG. 9. When the universal curve shown in FIG. 9 and the conventional universal curve shown in FIG. 1 are compared with each other, it is understood that experiment values and calculation (simulation) values are equal to each other at a high accuracy in a wide range from the 16th power impurity concentration to the 18th power impurity concentration in the function type model shown in FIG. 9 in the embodiment in comparison with the conventional model shown in FIG. 1.

In the function type model shown in FIG. 16B, any one of the carrier concentration and the impurity concentration may be simplified by an elementary function, and the other may be tabled as numerical values. For example, the contribution of the impurity concentration is tabled in the second equation, an approximate solution can be analytically given to the first equation by only the equation expressing $\mu c$. In this manner, the approximate solution can be correctly and rapidly calculated.

It is assumed that the parameters Cx and $\alpha x$ (x=1, 2) are extracted depending on the type of a film such as a thermal oxide film or a nitride-oxide film. In the manufacturing processes of a semiconductor device including the nitride-oxide film forming process, the parameter Cx is preferably a function of a nitrogen concentration.

In this manner, in the mobility model of carriers in the embodiment, the equation for calculating the component obtained by the ionized impurity scattering of the local mobility and the parameters are derived on the basis of the experiment fact related to the component obtained by the ionized impurity scattering of the effective mobility, and the integrodifferential equation expressing the physical relationship between the mobility obtained by the ionized impurity scattering of the local mobility, the local carrier concentration, and the impurity concentration is used, so that an effective mobility at an impurity concentration falling in a wide range can be correctly reproduced by one parameter set. In addition, when the integrodifferential equation is replaced with an approximate analytic equation, the mobility can be correctly calculated with an amount of calculation which is smaller than that of the above case. For this reason, the characteristics of a semiconductor device can be rapidly and correctly simulated, and it can be desired that the development efficiency of a semiconductor device is considerably improved.

A semiconductor device manufacturing method according to the embodiment of the present invention using the process and device simulation methods will be described below with reference to FIGS. 12 to 15.

The semiconductor device manufacturing method according to the embodiment of the present invention is executed by the following processing steps.

1) First, the structural information such as an outer shape, dimensions, and an impurity concentration of a semiconductor device to be manufactured is input (structural information input, step S201).

2) Discrete lattice points for process simulation is generated in the input semiconductor device structure (discrete lattice point generation, step S202).

When a conventional semiconductor device structure in which lattice points are generated is loaded, this step can be omitted.

3) Various conditions such as a temperature, an atmosphere, and a period of time of the thermal process are set (thermal process condition setting, step S203).

4) Thermal process time t is advanced by a "small amount Δt" (time increment, step S204).

5) Subsequently, the atmosphere of the thermal process is determined from the set thermal process conditions (thermal process atmosphere decision, step S205). If a nitridation atmosphere is determined, the flow shifts to (step S301); if a oxinitridation atmosphere is decided as the decision result, the flow shifts to (step S401) and if an oxidation atmosphere or an inert gas atmosphere is decided as the decision result, the flow shifts to (step S501).

6) It is determined whether an insulating film is present on a semiconductor substrate surface or not (decision of the presence/absence of the insulating film on the substrate surface, step S301). If the insulating film is present on the substrate surface, the flow shifts to (step S302); if the insulating film is absent on the substrate surface, the flow shifts to (step S304).

7) A nitrogen concentration CNox in the insulating film is determined (CNox determination, step S302).

8) Subsequently, diffusion parameters (e.g., equation (1-3) and equation (1-4)) are determined by using the nitrogen concentration CNox in the insulating film (diffusion parameter determination, step S303).

9) Nitride parameters related to nitridation step evaluation are determined (nitride parameter determination, step S304).

10) Subsequently, diffusion parameters related to diffusion step evaluation are determined (diffusion parameter determination, step S305).

11) A diffusion equation is solved by using the diffusion parameter determined in step S303 or step S305 to extract a concentration profile of an impurity in the semiconductor substrate (concentration profile extraction of the impurity, step S306).

12) It is determined whether the thermal step time reaches desired time or not (thermal step time decision, step S307). If the thermal step time reaches the desired time, the flow shifts to (step S308); and if the terminal step time does not reach the desired time, the flow shifts to (step S204).

13) The element characteristics of a semiconductor device are analyzed on the basis of the extracted concentration profile of an impurity in the semiconductor substrate (element characteristic analysis, step S308). Here, as a mobility model used in the device characteristic analysis, as described above, an equation for calculating a component obtained by ionized impurity scattering of a local mobility and parameters are derived on the basis of the experiment fact related to the component related to the component obtained by the ionized impurity scattering of the effective mobility, and an integrodifferential equation expressing the physical relationship between a mobility obtained by the ionized impurity scattering of the local mobility, a local carrier concentration, and an impurity concentration is used.

14) The extracted device characteristics are analyzed to determine semiconductor device manufacturing conditions for obtaining desired device characteristics (manufacturing parameter extraction, step S309).

15) The semiconductor manufacturing device is controlled by the determined semiconductor device conditions to manufacture an actual semiconductor device (semiconductor device manufacturing, step S310).

16) A nitrogen concentration CNox in an insulating film is determined (CNox determination, step S401).

17) Subsequently, diffusion parameters (e.g., equation (1-1) and equation (1-2)) are determined by using the nitrogen concentration CNox in the insulating film (diffusion parameter determination, step S402).

18) The diffusion equation is solved by using the diffusion parameters determined in step S402 to extract a concentration profile of an impurity in the semiconductor substrate (concentration profile extraction of the impurity, step S403).

19) It is determined whether the thermal step time reaches desired time or not (thermal step time decision, step S404). If the thermal step time reaches the desired time, the flow shifts to (step S308 to S310); and if the terminal step time does not reach the desired time, the flow shifts to (step S204).

20) It is determined whether an insulating film is present on a semiconductor substrate surface or not (decision of the presence/absence of the insulating film on the substrate surface, step S501). If the insulating film is present on the substrate surface, the flow shifts to (step S502); if the insulating film is absent on the substrate surface, the flow shifts to (step S504).

21) A nitrogen concentration CNox in an insulating film is determined (CNox determination, step S502).

22) Subsequently, diffusion parameters (e.g., equation (1-1) and equation (1-2)) are determined by using the nitrogen concentration CNox in the insulating film (diffusion parameter determination, step S503).

23) A nitride parameter related to nitridation step evaluation are determined (nitride parameter determination, step S504).

24) Subsequently, diffusion parameters related to diffusion step evaluation are determined (steps S306 to S310), the flow shifts to the following processes (diffusion parameter determination, step S505).

In this case, "Δt" represents a period of time (increment) which can be arbitrarily set to be a set value by an evaluator in advance, and the "insulating film" is desirably a gate oxide film. The "nitridation atmosphere" may be a nitride atmosphere such as an ammonia atmosphere, the "nitridation-oxidation atmosphere" may be a nitride-oxide atmosphere such as an NO gas or an $NO_2$ gas, the "oxide atmosphere" may be an oxide atmosphere such as a dry oxide atmosphere or a wet atmosphere, and the "inert gas atmosphere" may be an inert gas atmosphere consisting of nitride or argon.

COMPUTER PRODUCTS

A manufacturing process control device 110 according to the embodiment of the present invention may program data and store the data in a computer readable recording medium. When a semiconductor device is to be manufactured, the recording medium is loaded in a computer system, the program is stored in a storage unit such as a memory in the computer system, and a manufacturing process control program is executed by an arithmetic device, so that the semiconductor device manufacturing method according to the present invention can be realized. Here, the recording medium includes a computer readable recording medium such as a semiconductor memory, a magnetic disk, an optical disk, a photomagnetic disk, or a magnetic tape which can record a program.

OTHER EMBODIMENTS

As described above, the present invention includes various embodiments which are not described here as a matter of course. Therefore, the spirit and scope of the present invention are defined by only the following claims which are appropriate according to the above description.

What is claimed is:

1. A process simulation device for extracting impurity profile information in a substrate of a semiconductor device to be manufactured by solving a diffusion equation of an impurity in the substrate, comprising:

insulating film determination unit for determining whether an insulating film is present on the substrate surface or not;

in-insulating-film impurity concentration extraction unit for extracting the concentration of an impurity contained in the insulating film on the substrate surface;

diffusion parameter determination unit for determining diffusion parameter values constituting the diffusion equation as a function of the concentration of the impurity contained in the insulating film; and in-substrate impurity profile extraction unit for extracting the impurity profile information in the substrate by solving the diffusion equation in which the diffusion parameter values are introduced.

2. The process simulation device of claim 1, further comprising thermal step atmosphere determination unit for determining the type of an atmosphere of a thermal step performed to the substrate.

3. The process simulation device of claim 1, wherein the substrate is a silicon substrate, the insulating film is a silicon oxide film, and the impurity contained in the insulating film is nitrogen.

4. The process simulation device of claim 2, wherein the substrate is a silicon substrate, the insulating film is a silicon oxide film, and the impurity contained in the insulating film is nitrogen.

5. A process simulation method for extracting impurity profile information in a substrate of a semiconductor device to be manufactured by solving a diffusion equation of an impurity in the substrate, comprising the steps of:

determining whether an insulating film is present on the substrate surface or not;

extracting the concentration of an impurity contained in the insulating film on the substrate surface;

determining diffusion parameter values constituting the diffusion equation as a function of the concentration of the impurity contained in the insulating film; and extracting the impurity profile information in the substrate by solving the diffusion equation in which the diffusion parameter values are introduced.

6. The process simulation method of claim 5, further comprising the step of determining the type of an atmosphere of a thermal step performed to the substrate.

7. The process simulation method of claim 5, wherein the substrate is a silicon substrate, the insulating film is a silicon oxide film, and the impurity contained in the insulating film is nitrogen.

8. The process simulation method of claim 6, wherein the substrate is a silicon substrate, the insulating film is a silicon oxide film, and the impurity contained in the insulating film is nitrogen.

9. A computer readable recording medium which stores a process simulation program for extracting impurity profile information in a substrate of a semiconductor device to be manufactured by solving a diffusion equation of an impurity in the substrate, comprising and make the computer system execute the processes of:

an insulating film determination process for determining whether an insulating film is present on the substrate surface or not;

an in-insulating-film impurity concentration extraction process for extracting the concentration of an impurity contained in the insulating film on the substrate surface;

a diffusion parameter determination process for determining diffusion parameter values constituting the diffusion equation as a function of the concentration of the impurity contained in the insulating film; and an in-substrate impurity profile extraction process for extracting the impurity profile information in the substrate by solving the diffusion equation in which the diffusion parameter values are introduced.

10. The computer readable recording medium which stores a process simulation program of claim 9, further comprising and make the computer system execute the processes of:

a thermal step atmosphere determination process for determining the type of an atmosphere of a thermal step performed to the substrate.

11. The computer readable recording medium which stores a process simulation program of claim 9, wherein the substrate is a silicon substrate, the insulating film is a silicon oxide film, and the impurity contained in the insulating film is nitrogen.

12. The computer readable recording medium which stores a process simulation program of claim 10, wherein the substrate is a silicon substrate, the insulating film is a silicon oxide film, and the impurity contained in the insulating film is nitrogen.

13. A device simulation device which receives information of an impurity concentration profile and a device structure in a semiconductor substrate and evaluates the characteristics of the semiconductor device by using a carrier mobility model including a model for calculating a component obtained by ionized impurity scattering of a local mobility of carriers, wherein the model for calculating the component obtained by the ionized impurity scattering of the local mobility of carriers represents the relationship between the component obtained by the ionized impurity scattering of the local mobility of carriers, a local carrier concentration, and a local impurity concentration, and is a function type model expressing the relationship that a component obtained by ionized impurity scattering of an effective mobility of carriers is in proportion to an exponent of an average carrier concentration and is in inverse proportion to an exponent of an average impurity concentration.

14. The device simulation device of claim 13, wherein the function type model is constituted by an integrodifferential equation derived by a relational expression between Poisson's equation in the semiconductor substrate, an effective mobility of carriers, and a local mobility of carriers.

15. The device simulation device of claim 13, wherein the function type model is such that both of a term depending on the local carrier concentration of the component obtained by the ionized impurity scattering of the local mobility of carriers and a term depending on the local impurity concentration are simplified by an elementary function to approximately express the characteristics of the function type model.

16. The device simulation device of claim 13, wherein the function type model is such that one of a term depending on the local carrier concentration of the component obtained by the ionized impurity scattering of the local mobility of carriers and a term depending on the local impurity concentration is simplified by an elementary function to approximately express the characteristics of the function type model, and the other is tabled as values which are calculated in advance.

17. A device simulation method which receives information of an impurity concentration profile and a device structure in a semiconductor substrate and evaluates the characteristics of the semiconductor device by using a carrier mobility model including a model for calculating a component obtained by ionized impurity scattering of a local mobility of carriers, wherein
the model for calculating the component obtained by the ionized impurity scattering of the local mobility of carriers represents the relationship between the component obtained by the ionized impurity scattering of the local mobility of carriers, a local carrier concentration, and a local impurity concentration, and is a function type model expressing the relationship that a component obtained by ionized impurity scattering of an effective mobility of carriers is in proportion to an exponent of an average carrier concentration and is in inverse proportion to an exponent of an average impurity concentration.

18. The device simulation method of claim 17, wherein the function type model is constituted by an integrodifferential equation derived by a relational expression between Poisson's equation in the semiconductor substrate, an effective mobility of carriers, and a local mobility of carriers.

19. The device simulation method of claim 17, wherein the function type model is such that both of a term depending on the local carrier concentration of the component obtained by the ionized impurity scattering of the local mobility of carriers and a term depending on the local impurity concentration are simplified by an elementary function to approximately express the characteristics of the function type model.

20. The device simulation method of claim 17, wherein the function type model is such that one of a term depending on the local carrier concentration of the component obtained by the ionized impurity scattering of the local mobility of carriers and a term depending on the local impurity concentration is simplified by an elementary function to approximately express the characteristics of the function type model, and the other is tabled as values which are calculated in advance.

21. A recording medium which stores a device simulation program which receives information of an impurity concentration profile and a device structure in a semiconductor substrate and evaluates the characteristics of the semiconductor device by using a carrier mobility model including a model for calculating a component obtained by ionized impurity scattering of a local mobility of carriers, wherein
the model for calculating the component obtained by the ionized impurity scattering of the local mobility of carriers represents the relationship between the component obtained by the ionized impurity scattering of the local mobility of carriers, a local carrier concentration, and a local impurity concentration, and is a function type model expressing the relationship that a component obtained by ionized impurity scattering of an effective mobility of carriers is in proportion to an exponent of an average carrier concentration and is in inverse proportion to an exponent of an average impurity concentration.

22. The computer readable recording medium which stores a device simulation program of claim 21, wherein the function type model is constituted by an integrodifferential equation derived by a relational expression between Poisson's equation in the semiconductor substrate, an effective mobility of carriers, and a local mobility of carriers.

23. The computer readable recording medium which stores a device simulation program of claim 21, wherein the function type model is such that both of a term depending on the local carrier concentration of the component obtained by the ionized impurity scattering of the local mobility of carriers and a term depending on the local impurity concentration are simplified by an elementary function to approximately express the characteristics of the function type model.

24. The computer readable recording medium which stores a device simulation program of claim 21, wherein the function type model is such that one of a term depending on the local carrier concentration of the component obtained by the ionized impurity scattering of the local mobility of carriers and a term depending on the local impurity concentration is simplified by an elementary function to approximately express the characteristics of the function type model, and the other is tabled as values which are calculated in advance.

25. A semiconductor device manufacturing system which extracts impurity profile information in a substrate of a semiconductor device to be manufactured by solving a diffusion equation of an impurity in the substrate, evaluates the electric characteristics of a semiconductor by using a carrier mobility model on the basis of the information of the impurity profile and the element structure in the semiconductor substrate, determines manufacturing conditions of a semiconductor device having desired electric characteristics on the basis of the evaluation result, and manufactures a semiconductor device on the basis of the determined manufacturing conditions, comprising:
insulating film determination unit for determining whether an insulating film is present on the substrate surface or not;
in-insulating-film impurity concentration extraction unit for extracting the concentration of an impurity contained in the insulating film on the substrate surface;
diffusion parameter determination unit for determining diffusion parameter values constituting the diffusion equation as a function of the concentration of the impurity contained in the insulating film; and
in-substrate impurity profile extraction unit for extracting the impurity profile information in the substrate by solving the diffusion equation in which the diffusion parameter values are introduced.

26. A semiconductor device manufacturing method which extracts impurity profile information in a substrate of a semiconductor device to be manufactured by, solving a diffusion equation of an impurity in the substrate, evaluates the electric characteristics of a semiconductor by using a carrier mobility model on the basis of the information of the impurity profile and the element structure in the semiconductor substrate, determines manufacturing conditions of a semiconductor device having desired electric characteristics on the basis of the evaluation result, and manufactures a semiconductor device on the basis of the determined manufacturing conditions, comprising the steps of:

determining whether an insulating film is present on the substrate surface or not;

extracting the concentration of an impurity contained in the insulating film on the substrate surface;

determining diffusion parameter values constituting the diffusion equation as a function of the concentration of the impurity contained in the insulating film; and extracting the impurity profile information in the substrate by solving the diffusion equation in which the diffusion parameter values are introduced.

27. A semiconductor device manufacturing system which receives information of an impurity concentration profile and a device structure in a semiconductor; substrate, evaluates the characteristics of the semiconductor device by using a carrier mobility model including a model for calculating a component obtained by ionized impurity scattering of a local mobility of carriers, determines manufacturing conditions of a semiconductor device having desired electric characteristics on the basis of the evaluation result, and manufactures a semiconductor device on the basis of the determined manufacturing conditions, wherein the model for calculating the component obtained by the ionized impurity scattering of the local mobility of carriers represents the relationship between the component obtained by the ionized impurity scattering of the local mobility of carriers, a local carrier concentration, and a local impurity concentration, and is a function type model expressing the relationship that a component obtained by ionized impurity scattering of an effective mobility of carriers is in proportion to an exponent of an average carrier concentration and is in inverse proportion to an exponent of an average impurity concentration.

28. A semiconductor device manufacturing method which receives information of an impurity concentration profile and a device structure in a semiconductor substrate, evaluates the characteristics of the semiconductor device by using a carrier mobility model including a model for calculating a component obtained by ionized impurity scattering of a local mobility of carriers, determines manufacturing conditions of a semiconductor device having desired electric characteristics on the basis of the evaluation result, and manufactures a semiconductor device on the basis of the determined manufacturing conditions, wherein the model for calculating the component obtained by the ionized impurity scattering of the local mobility of carriers represents the relationship between the component obtained by the ionized impurity scattering of the local mobility of carriers, a local carrier concentration, and a local impurity concentration, and is a function type model expressing the relationship that a component obtained by ionized impurity scattering of an effective mobility of carriers is in proportion to an exponent of an average carrier concentration and is in inverse proportion to an exponent of an average impurity concentration.

* * * * *